United States Patent
Sonehara et al.

(10) Patent No.: US 10,141,327 B2
(45) Date of Patent: Nov. 27, 2018

(54) SEMICONDUCTOR MEMORY DEVICE

(71) Applicant: Toshiba Memory Corporation, Minato-ku (JP)

(72) Inventors: Takeshi Sonehara, Yokkaichi (JP); Masaru Kito, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 142 days.

(21) Appl. No.: 15/264,994

(22) Filed: Sep. 14, 2016

(65) Prior Publication Data
US 2017/0271361 A1   Sep. 21, 2017

Related U.S. Application Data

(60) Provisional application No. 62/309,997, filed on Mar. 18, 2016.

(51) Int. Cl.
| | |
|---|---|
| *H01L 27/115* | (2017.01) |
| *H01L 27/11582* | (2017.01) |
| *H01L 23/532* | (2006.01) |
| *H01L 23/528* | (2006.01) |
| *H01L 27/11573* | (2017.01) |
| *H01L 49/02* | (2006.01) |
| *H01L 27/11556* | (2017.01) |

(52) U.S. Cl.
CPC ...... *H01L 27/11582* (2013.01); *H01L 23/528* (2013.01); *H01L 23/5329* (2013.01); *H01L 23/53295* (2013.01); *H01L 27/11573* (2013.01); *H01L 28/00* (2013.01); *H01L 27/11556* (2013.01)

(58) Field of Classification Search
CPC .......... H01L 27/11582; H01L 27/1157; H01L 27/11573
See application file for complete search history.

(56) References Cited

U.S. PATENT DOCUMENTS

| | | | |
|---|---|---|---|
| 9,356,043 B1* | 5/2016 | Sakakibara | H01L 27/11582 |
| 9,748,266 B1* | 8/2017 | Baraskar | H01L 27/11582 |
| 9,768,117 B1* | 9/2017 | Naito | H01L 23/5283 |
| 9,799,657 B2* | 10/2017 | Noh | H01L 21/02323 |
| 9,842,851 B2* | 12/2017 | Pachamuthu | H01L 27/11582 |
| 9,842,856 B2* | 12/2017 | Okamoto | H01L 27/11582 |
| 9,911,752 B2* | 3/2018 | Kashima | H01L 27/11582 |
| 9,997,537 B2* | 6/2018 | Lee | H01L 27/11582 |
| 2004/0109355 A1 | 6/2004 | Yamauchi | |
| 2009/0121271 A1* | 5/2009 | Son | H01L 21/8221 257/315 |

(Continued)

*Primary Examiner* — Andres Munoz
(74) *Attorney, Agent, or Firm* — Oblon, McClelland, Maier & Neustadt, L.L.P.

(57) ABSTRACT

According to an embodiment, a semiconductor memory device comprises: an insulating layer disposed on a semiconductor substrate; a plurality of memory cell arrays being arranged three-dimensionally on the insulating layer and including a plurality of conductive layers stacked in a first direction that intersects a surface of the semiconductor substrate; and a block insulating layer covering a side surface of one of the plurality of conductive layers. A high permittivity layer is provided between the insulating layer and a lowermost layer of the plurality of conductive layers. A permittivity of the high permittivity layer is much higher than that of the insulating layer.

15 Claims, 24 Drawing Sheets

(56) References Cited

U.S. PATENT DOCUMENTS

| | | | |
|---|---|---|---|
| 2009/0230458 A1 | 9/2009 | Ishiduki et al. | |
| 2011/0284946 A1* | 11/2011 | Kiyotoshi | H01L 27/11565 257/324 |
| 2012/0211823 A1 | 8/2012 | Lim et al. | |
| 2012/0299117 A1* | 11/2012 | Lee | H01L 29/7926 257/390 |
| 2014/0054675 A1* | 2/2014 | Lee | H01L 29/7926 257/324 |
| 2014/0070302 A1* | 3/2014 | Yoo | H01L 27/1157 257/324 |
| 2016/0111437 A1* | 4/2016 | Pang | H01L 27/11556 257/324 |

* cited by examiner

FIG.15
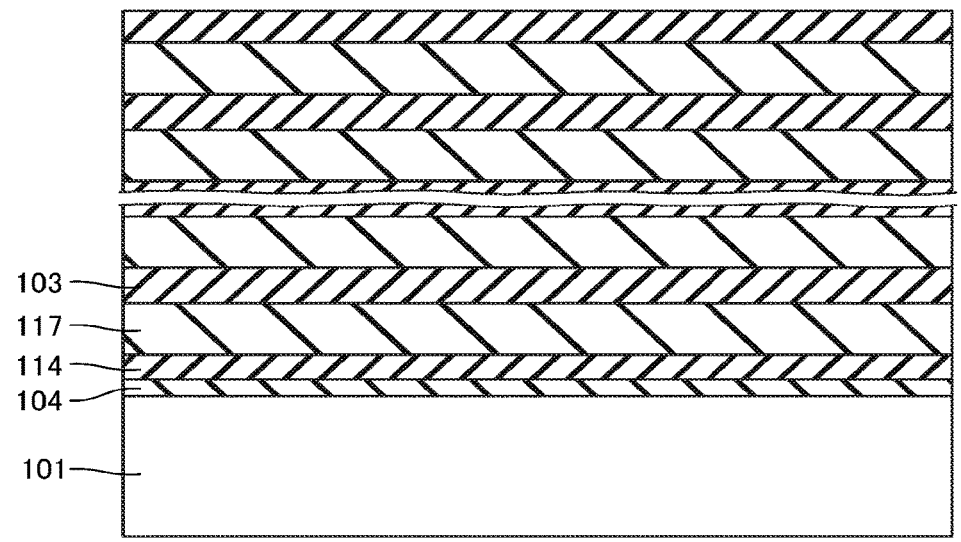
FIG/16
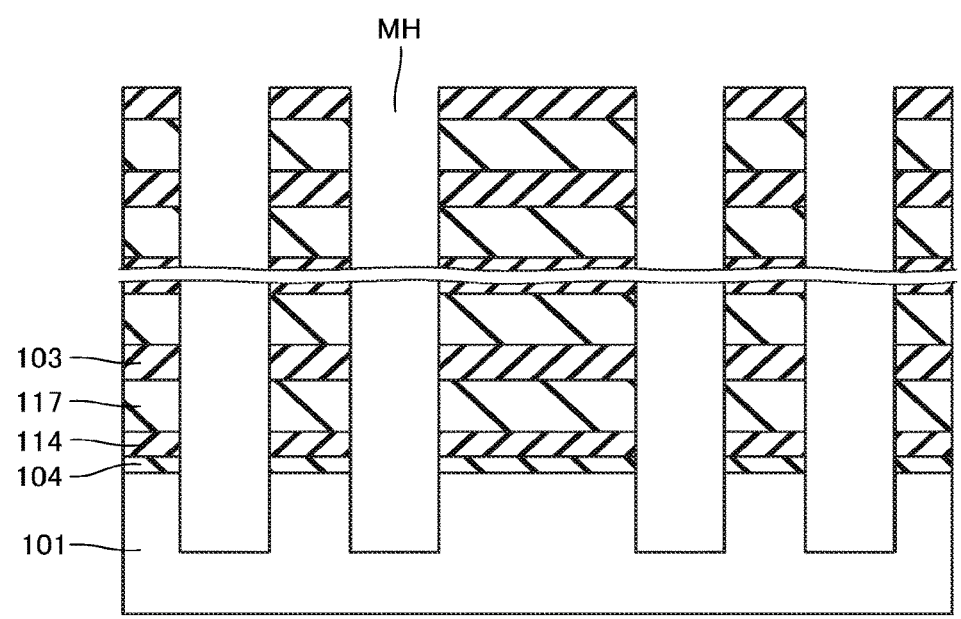

SEMICONDUCTOR MEMORY DEVICE

CROSS REFERENCE TO RELATED APPLICATION

This application is based upon and claims the benefit of priority from US Provisional Patent Application No. 62/309,997, filed on Mar. 18, 2016, the entire contents of which are incorporated herein by reference.

FIELD

Embodiments described herein relate to a semiconductor memory device.

BACKGROUND

A flash memory that stores data by accumulating a charge in a charge accumulation layer, is known. Such a flash memory is connected by a variety of systems, such as NAND type or NOR type, and configures a semiconductor memory device. In recent years, increasing of capacity and raising of integration level of such a semiconductor memory device have been proceeding. Moreover, a semiconductor memory device in which memory cell arrays are disposed three-dimensionally (a three-dimensional type semiconductor memory device) has been proposed to raise the integration level of the memory. In addition, it is also being required that both increased capacity and miniaturization are achieved.

BRIEF DESCRIPTION OF THE DRAWINGS

FIGS. 9 to 24 are cross-sectional views showing manufacturing steps of the same semiconductor memory device.

DETAILED DESCRIPTION

Figure 1:
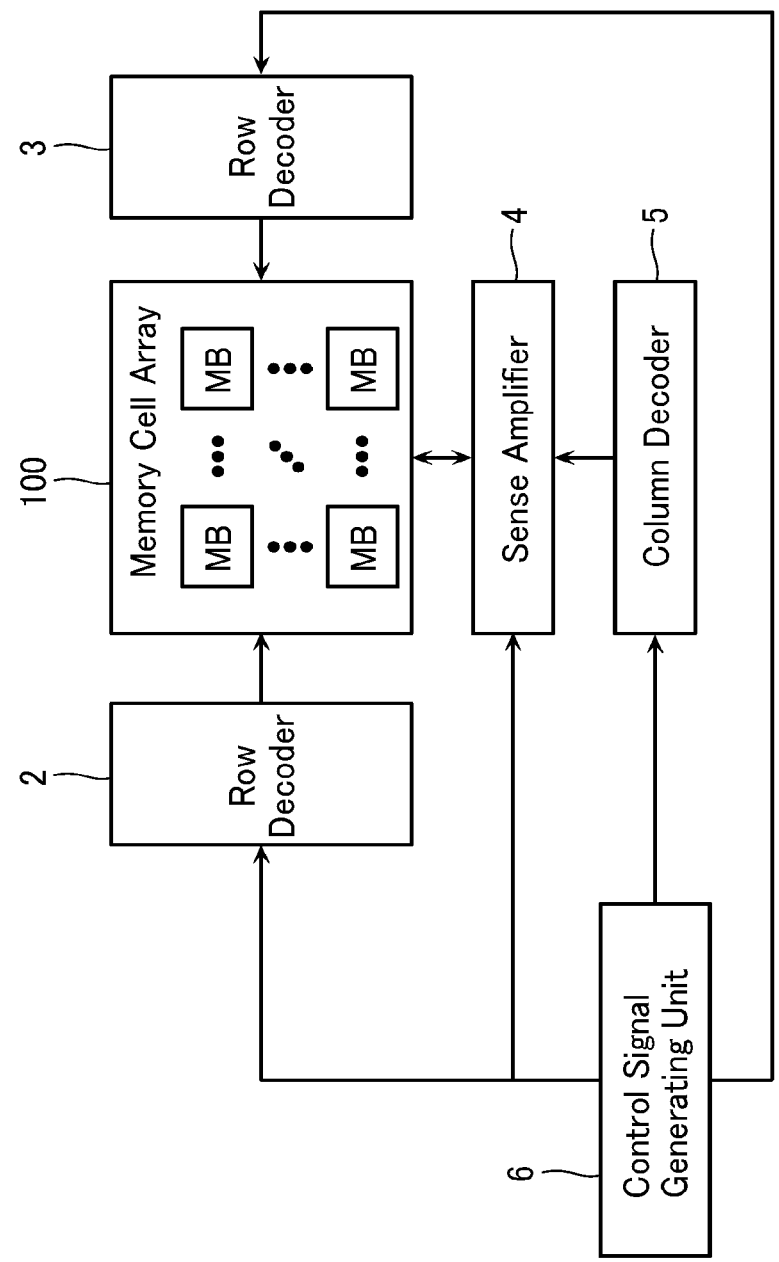
FIG. 1 is a functional block diagram showing a schematic configuration of a semiconductor memory device according to a first embodiment.

According to an embodiment, a semiconductor memory device comprises: an insulating layer disposed on a semiconductor substrate; a plurality of memory cell arrays being arranged three-dimensionally on the insulating layer and including a plurality of conductive layers stacked in a first direction that intersects a surface of the semiconductor substrate; and a block insulating layer covering a side surface of one of the plurality of conductive layers. A high permittivity layer is provided between the insulating layer and a lowermost layer of the plurality of conductive layers. A permittivity of the high permittivity layer is much higher than that of the insulating layer.

First Embodiment

[Configuration]

Next, semiconductor memory devices according to embodiments will be described in detail with reference to the drawings. Note that these embodiments are merely examples. For example, each of the drawings of the semiconductor memory devices employed in the embodiments below is schematic, and thicknesses, widths, ratios, and so on, of layers are not necessarily identical to those of the actual semiconductor memory devices.

Moreover, the embodiments below relate to semiconductor memory devices having a structure in which a plurality of MONOS (Metal-Oxide-Nitride-Oxide-Semiconductor) type memory cells (transistors) are stacked along a direction intersecting a surface of a substrate (a Z direction in the drawings referred to hereafter), on the substrate, each of the MONOS type memory cells including: a semiconductor film acting as a channel provided in a column shape in the Z direction; and a gate electrode film provided, via a charge accumulation layer, on a side surface of the semiconductor film. However, the memory cell may be a memory cell of another form, for example, a SONOS (Semiconductor-Oxide-Nitride-Oxide-Semiconductor) type memory cell or MANOS (Metal-Aluminum Oxide-Nitride-Oxide-Semiconductor) type memory cell, or a floating gate type memory cell.

First Embodiment

FIG. 1 is a functional block diagram showing a configuration of a semiconductor memory device according to a first embodiment. The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC (not shown; mentioned later in FIG. 3) arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a voltage employed during write, erase or the read operation, generates a control signal and controls the row decoders 2 and 3, the sense amplifier 4, and the column decoder 5.

Figure 2:
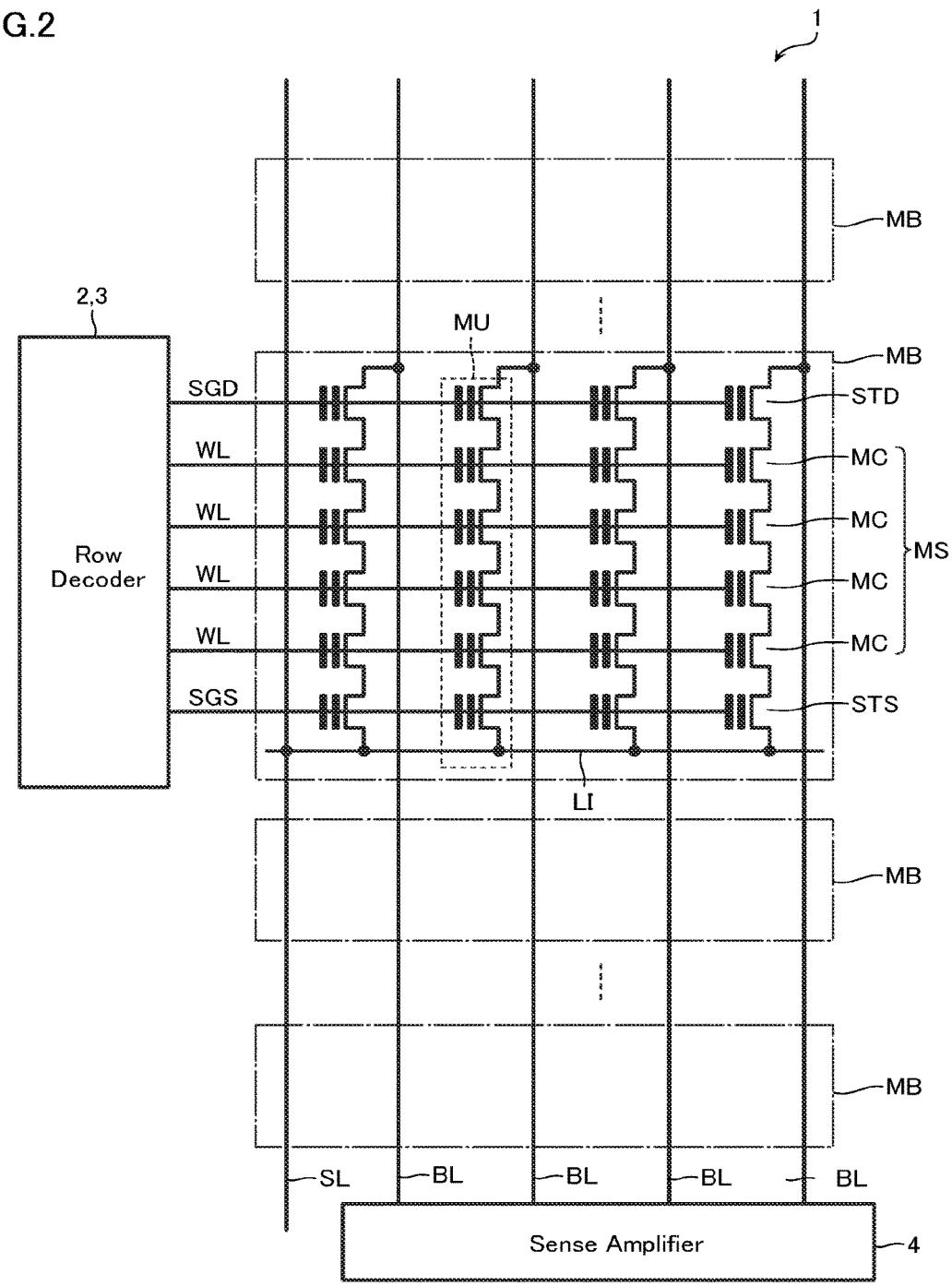
FIG. 2 is an equivalent circuit diagram showing a configuration of a memory cell array 1 of the same semiconductor memory device.

FIG. 2 is an equivalent circuit diagram showing a configuration of part of the memory cell array 1 according to the present embodiment.

The memory cell array 1 according to the present embodiment comprises the plurality of memory blocks MB. Moreover, a plurality of bit lines BL and a source line SL are commonly connected to these plurality of memory blocks MB. Each of the memory blocks MB is connected to the sense amplifier via the bit line BL and to an unillustrated source line driver via the source line SL.

The memory block MB comprises a plurality of memory units MU each having its one end connected to the bit line BL and having its other end connected, via a source contact LI, to the source line SL.

The memory unit MU comprises a plurality of the memory cells MC connected in series. As will be mentioned later, the memory cell MC comprises: a semiconductor layer; a charge accumulation layer; and a control gate. In addition, during various operations, a charge is accumulated in the charge accumulation layer (write operation), moreover, a charge is erased from the charge accumulation layer (erase operation), based on a voltage applied to the control gate, whereby a threshold value of the memory cell MC is changed. Data stored in the memory cell MC is determined (read operation) by detecting a magnitude of this threshold value. Note that hereafter, the plurality of memory cells MC connected in series will be called a "memory string MS".

Commonly connected to the control gates of pluralities of the memory cells MC configuring different memory strings MS are, respectively, word lines WL. These pluralities of memory cells MC are connected to the row decoder via the word lines WL.

The memory unit MU comprises a drain side select gate transistor STD connected between the memory string MS and the bit line BL. Connected to a control gate of the drain side select gate transistor STD is a drain side select gate line SGD. The drain side select gate line SGD is connected to the row decoder and selectively connects the memory string MS and the bit line BL based on an inputted signal.

The memory unit MU comprises a source side select gate transistor STS connected between the memory string MS and the source contact LI. Connected to a control gate of the source side select gate transistor STS is a source side select gate line SGS. The source side select gate line SGS is connected to the row decoder and selectively connects the memory string MS and the source line SL based on an inputted signal.

Figure 3:
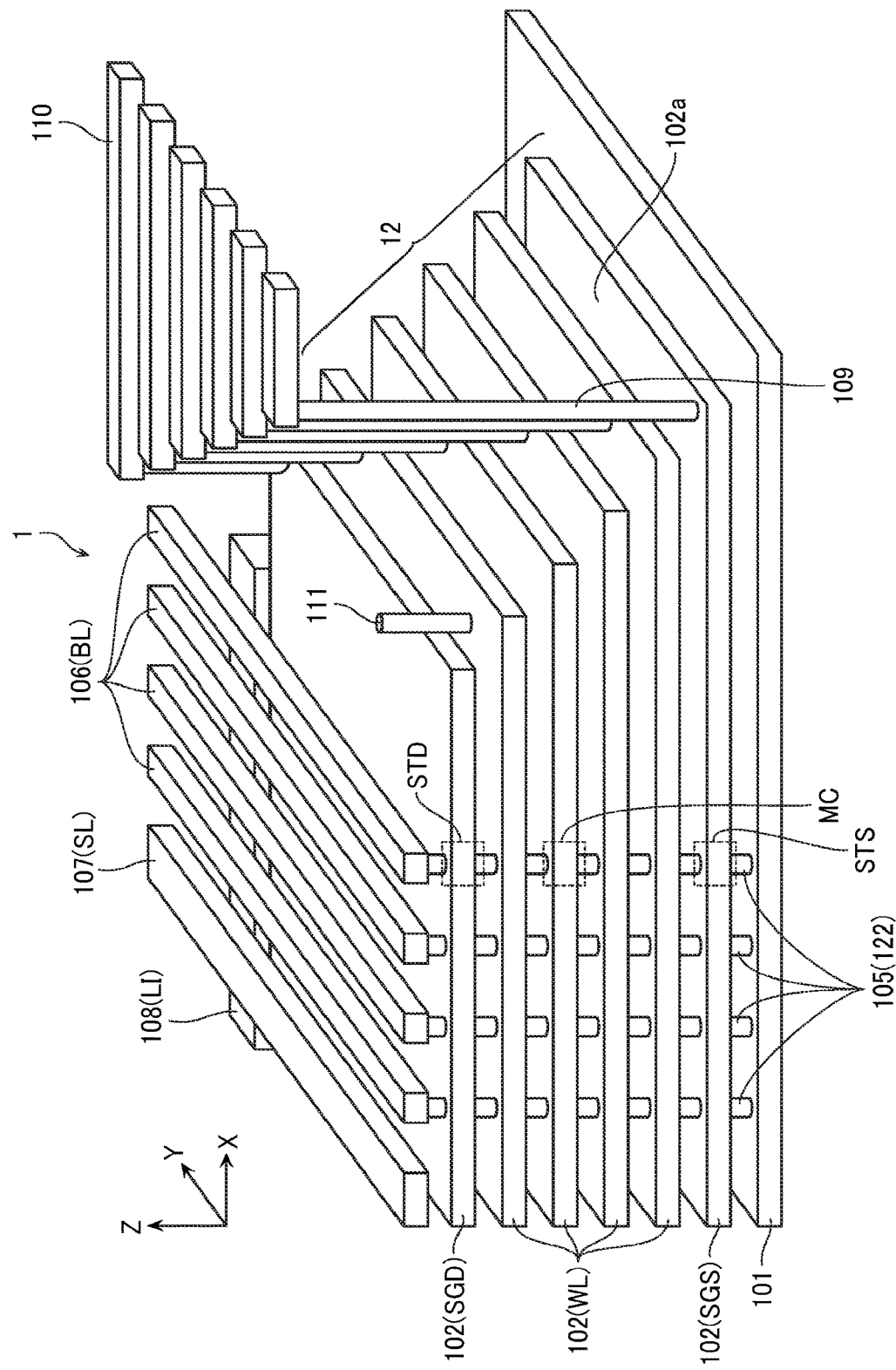
FIG. 3 is a perspective view showing a configuration of the memory cell array 1 of the same semiconductor memory device.

FIG. 3 is a schematic perspective view showing a configuration of part of the memory cell array 1. Note that in FIG. 3, in order to explain mainly a principal portion of the memory cell array 1, such as a conductive layer, part of the configuration, such as an insulating layer, is omitted.

The memory cell array 1 according to the present embodiment comprises: a substrate 101; and a plurality of conductive layers 102 stacked in the Z direction on the substrate 101. In addition, the memory cell array 1 includes a plurality of memory columnar bodies 105 extending in the Z direction. As shown in FIG. 3, an intersection of the conductive layer 102 and the memory columnar body 105 functions as the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, and the drain side select gate line SGD.

A conductive layer 106 functioning as the bit line BL and a conductive layer 107 functioning as the source line SL are disposed above the conductive layer 102.

As shown in FIG. 3, the memory cell array 1 comprises a conductive layer 108 that faces side surfaces in a Y direction of the plurality of conductive layers 102 and extends in an X direction. A lower surface of the conductive layer 108 contacts the substrate 101. The conductive layer 108 is configured from a conductive layer of the likes of tungsten (W), for example, and functions as the source contact LI.

The plurality of conductive layers 102 are formed in a stepped shape at their ends in the X direction and configure a stepped part 12.

A contact part 102a is formed at an extremity of each step configuring the stepped part 12. A contact 109 is disposed in the contact part 102a. The contact 109 is connected to an upper wiring line 110. Moreover, the stepped part 12 may comprise a support column 111 extending in the Z direction to penetrate the stepped part 12. The support column 111 functions to maintain a posture of a stacked structure of the memory cell array 1 in a later-described step of replacing a sacrifice layer with a conductive layer. To simplify explanation, only one support column 111 is shown, but a plurality of support columns 111 may be provided.

Figure 4:
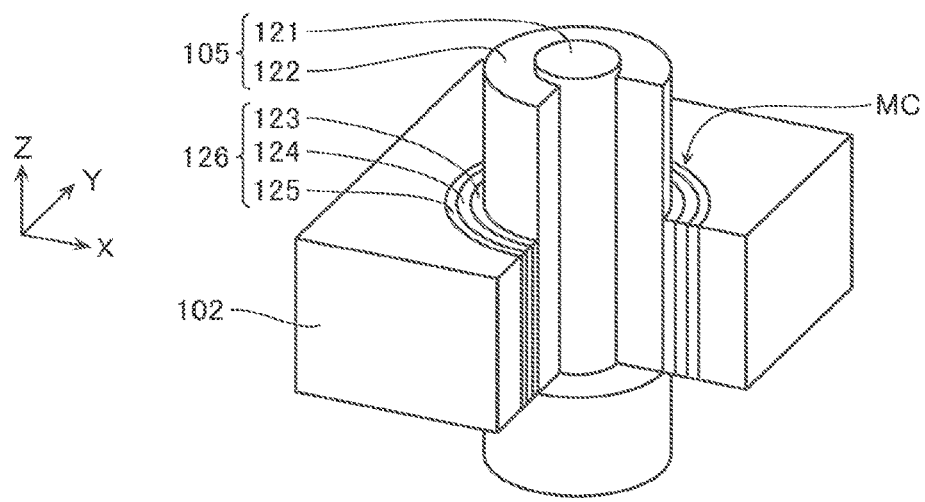
FIG. 4 is a schematic perspective cross-sectional view showing an example of configuration of one memory cell MC included in the same semiconductor memory device.

FIG. 4 is a schematic perspective view showing a configuration of the memory cell MC. Note that FIG. 4 shows the configuration of the memory cell MC, but the source side select gate transistor STS and the drain side select gate transistor STD may also be configured similarly to the memory cell MC. Moreover, in FIG. 4, in order to explain mainly a principal configuration of the memory cell MC, such as a conductive layer, a memory layer, or a semiconductor layer, part of the configuration, such as an insulating layer disposed above/below the conductive layer 102 or a barrier metal layer, is omitted.

The memory cell MC is provided so as to extend in the Z direction, at an intersection of the conductive layer 102 and the memory columnar body 105. The memory columnar body 105 comprises: a core insulating layer 121; and a semiconductor layer 122. The semiconductor layer 122 covers a sidewall of the core insulating layer 121. Moreover, a memory film 126 is provided between the semiconductor layer 122 and the conductive layer 102. The memory film 126 includes: a tunnel insulating layer 123; a charge accumulation layer 124; and a block insulating layer 125.

The core insulating layer 121 is configured from an insulating layer of the likes of silicon oxide, for example. The semiconductor layer 122 is configured from a semiconductor layer of the likes of polysilicon, for example. Moreover, the semiconductor layer 122 functions as a channel body of the memory cell MC, the source side select gate transistor STS, and the drain side select gate transistor STD. The tunnel insulating layer 123 and the block insulating layer 125 are configured from an insulating layer of the likes of silicon oxide, for example. The charge accumulation layer 124 is configured from an insulating layer capable of accumulating a charge, of the likes of silicon nitride, for example.

Figure 5:
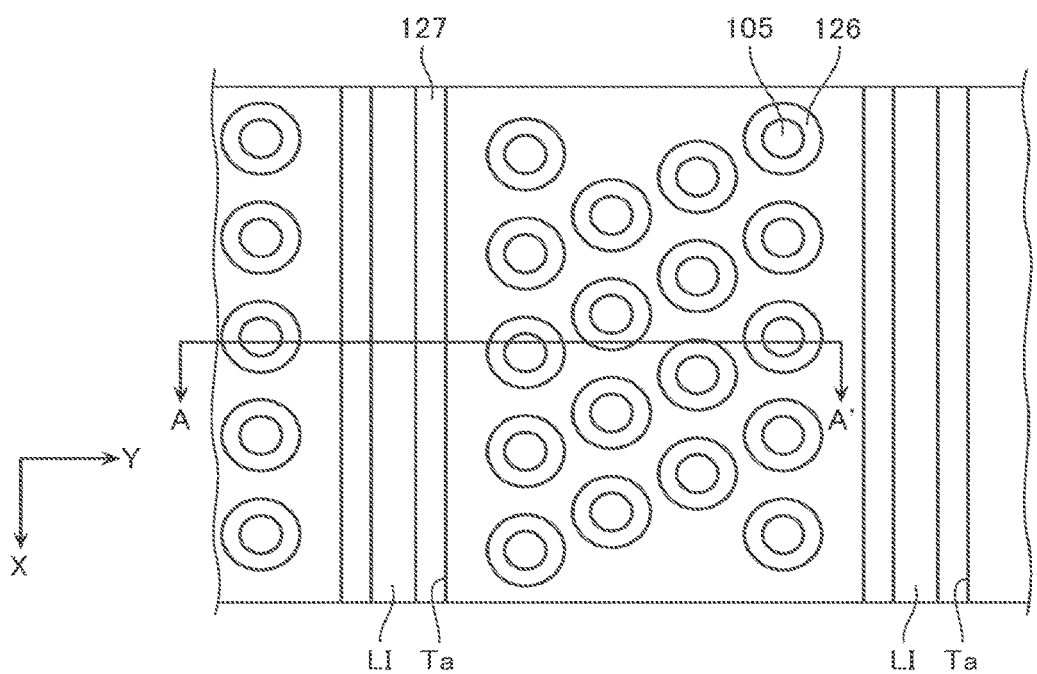
FIG. 5 is a plan view showing a configuration of part of the memory cell array 1 included in the same semiconductor memory device.
Figure 6:
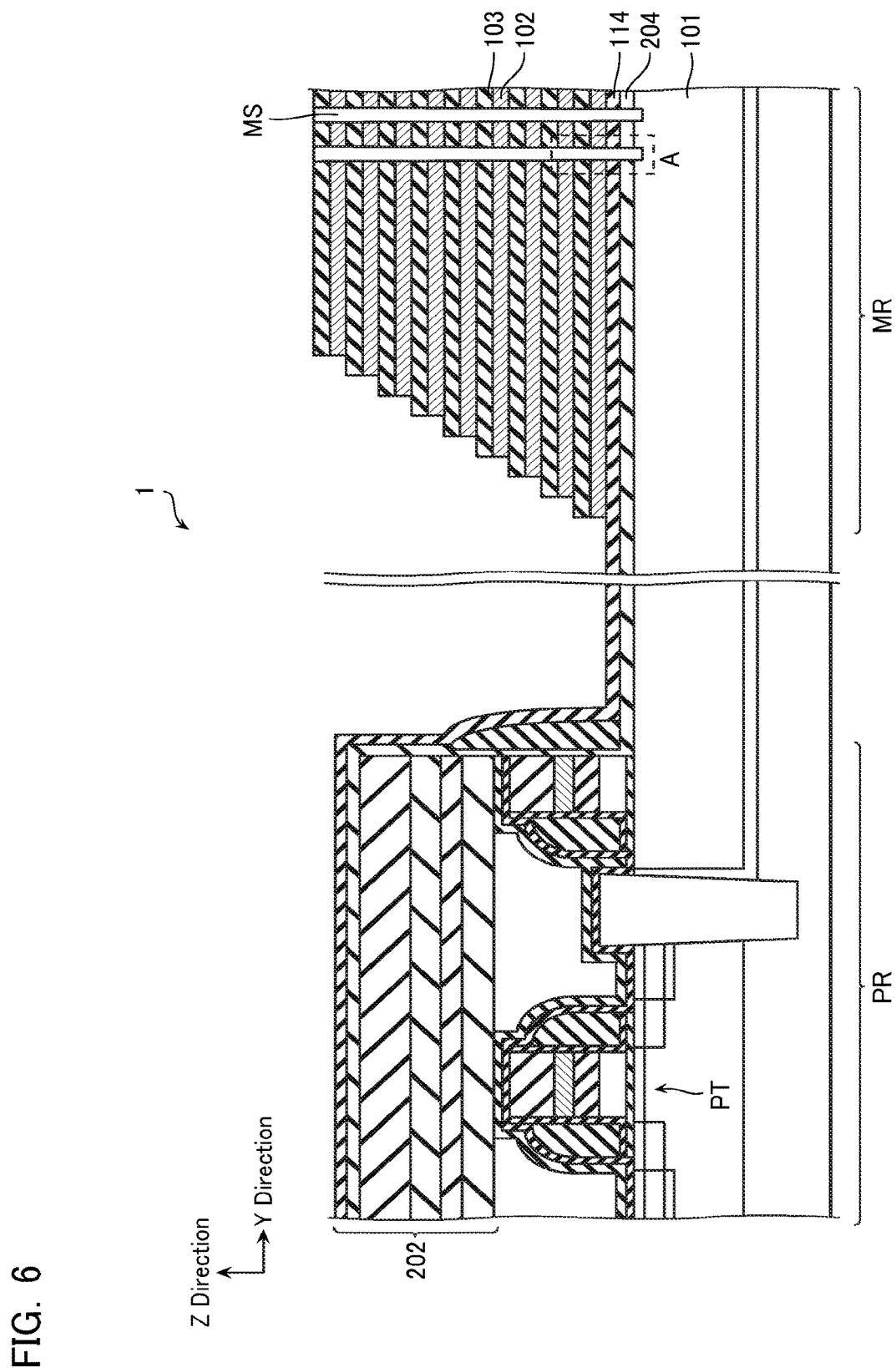
FIGS. 6 to 8 are schematic cross-sectional views showing configurations of the same semiconductor memory device.
Figure 7:
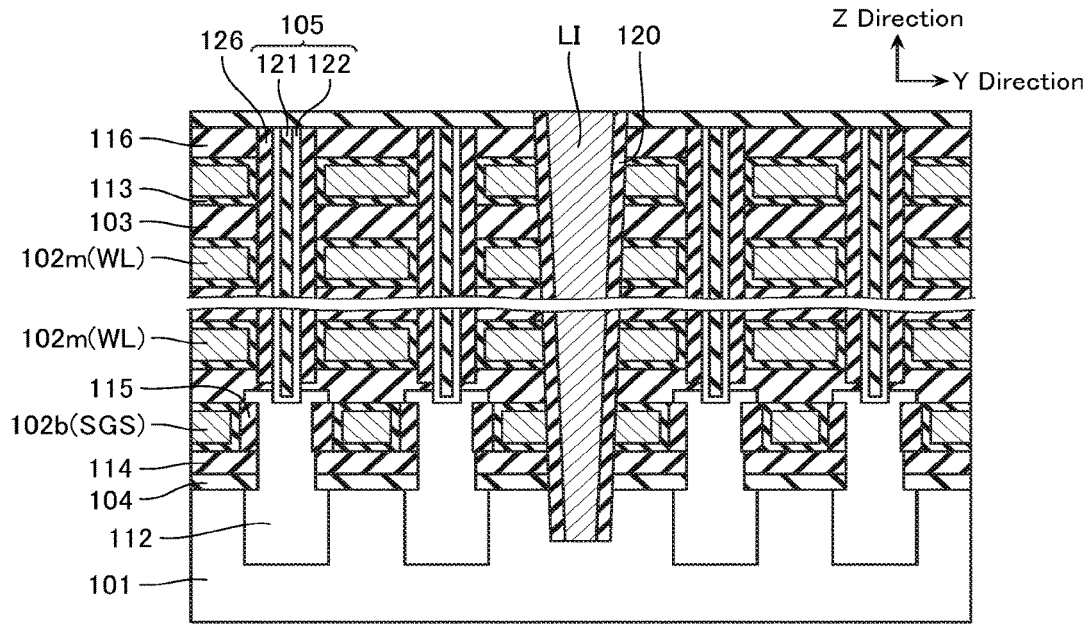
Figure 8:
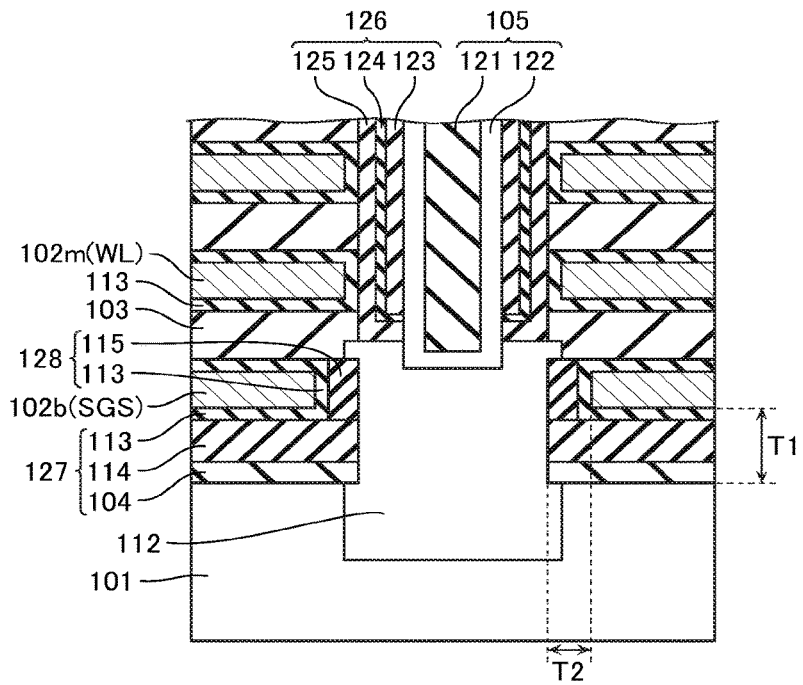

Next, a configuration of the semiconductor memory device according to the present embodiment will be described in more detail with reference to FIGS. 5 to 8. FIG. 5 is a plan view showing a configuration of part of the memory cell array 1. FIG. 6 is a cross-sectional view showing a configuration of a portion including a memory cell array region MR and a peripheral region PR, of the memory cell array 1. FIG. 7 is a cross-sectional view along the Y direction (a cross-sectional view taken along the line A-A' of FIG. 5) of the memory cell array 1. Moreover, in FIG. 7, part of the configuration, such as an upper wiring line, is omitted. In addition, FIG. 8 is an enlarged view of the portion surrounded by the dotted line A in FIG. 6.

As shown in FIG. 5, in the present embodiment, the memory columnar bodies 105 are arranged staggered. In addition, the source contact LI is formed in a striped shape having the X direction as its longitudinal direction. This source contact LI is implanted, via an inter-layer insulating layer 127, in a slit Ta that divides the memory cell array 1 in a block unit. The source contact LI is configured from a metal such as tungsten, for example. The inter-layer insulating layer 120 is configured from an insulating material such as silicon oxide, for example.

As shown in FIG. 6, the memory cell array 1 includes the memory cell array region MR in which the memory string MS including a plurality of the memory cells MC is disposed on the semiconductor substrate 101, and a plurality of the conductive layers 102 connected to the memory string MS are stacked in the Z direction.

Moreover, the peripheral region PR where a peripheral transistor PT is disposed, is provided in a periphery of the memory cell array region MR.

As shown in FIGS. 7 and 8, the memory cell array 1 of the present embodiment has an insulating layer 104 disposed on the semiconductor substrate 101. The insulating layer 104 is configured from silicon oxide, for example.

A plurality of the conductive layers 102 and inter-layer insulating layers 103 are stacked alternately on the insulating layer 104. The conductive layer 102 functions as the source side select gate line SGS, the word line WL, or the drain side select gate line SGD.

A side surface of the conductive layer 102 is covered by a block insulating layer 113. The block insulating layer 113 is configured from an insulating layer of the likes of hafnium oxide (HfOx) or tantalum oxide (TaOx), for example.

In addition, an epitaxial layer 112 is provided on the semiconductor substrate 101. The epitaxial layer 112 is configured from epitaxial silicon caused by solid phase growth of the substrate 101. The above-mentioned memory columnar body 105 and memory film 126 are provided on the epitaxial layer 112. Moreover, the epitaxial layer 112 is provided extending in the Z direction, such that its upper surface is positioned between a lowermost layer conductive layer 102b and a second conductive layer 102m counting from a substrate 101 side. In other words, a side surface of the epitaxial layer 112 faces the lowermost layer conductive layer 102b. In addition, the side surface of the epitaxial layer 112 contacts the insulating layer 104 and a later-described high permittivity layer 114. Moreover, an oxide layer 115 is provided between the conductive layer 102b and the side surface of the epitaxial layer 112. The oxide layer 115 is formed by oxidizing part of the epitaxial layer 112 which is configured from silicon, and is configured from silicon oxide.

In the present embodiment, the high permittivity layer 114 is provided between the lowermost layer conductive layer 102b and the insulating layer 104. The high permittivity layer 114 has a permittivity which is much higher than a permittivity of the insulating layer 104. When the insulating layer 104 is configured from silicon oxide (permittivity=approximately 3.9), the high permittivity layer 114 may be configured from an oxide that includes a metal such as aluminum, hafnium, zirconium, titanium, or tantalum, for example. Moreover, the high permittivity layer 114 is sometimes configured using the same material as the block insulating layer 113. However, it is undesirable to employ silicon nitride as the high permittivity layer 114. This is because there is a risk that in a later-described step of forming the conductive layer 102 (FIGS. 20 to 22), when a sacrifice layer 117 of silicon nitride is removed (FIG. 20), the high permittivity layer 114 is also removed.

Now, in a three-dimensional type semiconductor memory device where memory cells are disposed three-dimensionally like that of the present embodiment, memory capacity is increased by stacking the memory cells in the Z direction intersecting the substrate surface. At this time, there occurs an area increase of a terrace part of the word line WL (a portion where a contact is lowered to join the word line WL to the likes of an upper wiring line), provided at an end of the memory cell array, as the number of stacked layers increases. In other words, an increase in chip area occurs along with an increase in memory capacity. While on the one hand, chip area increases dramatically according to the number of layers, on the other hand, area reduction of the terrace part is required for demands of miniaturization. Therefore, the contact must be reliably disposed in the limited area of the terrace part, moreover, as the number of stacked layers increases, the contact must be reliably connected to each layer, and as a result, a degree of difficulty of contact formation dramatically rises. Furthermore, by the number of stacked layers increasing, aspect ratio during via hole processing for forming the contact increases, and the risk of ending up penetrating to an unintended layer also increases.

In particular, the insulating layer (insulating layer 104 in the present embodiment) under the lowermost layer conductive layer (conductive layer 102b in the present embodiment) is sometimes impaired by receiving damage during processing of RIE or the like due to a contact penetration margin decreasing by film thinning, or damage due to gas coming from the conductive layer such as the word line WL or a barrier metal. When the insulating layer directly above the substrate is impaired, there is an increased risk that a leak current occurs or that reliability of device characteristics lowers due to a sufficient cell current being unobtainable. Furthermore, when the insulating layer directly above the substrate is impaired, there is a risk that an effect is exerted even on formation of a channel linking from the source contact LI to each of the memory strings MS, and that device characteristics of the entire memory block deteriorate.

Accordingly, in the present embodiment, as described above, the high permittivity layer 114 having a permittivity which is much higher than the permittivity of the insulating layer 104 is disposed between the lowermost layer conductive layer 102b and the substrate 101, in addition to the insulating layer 104 being disposed between those layers.

Providing the high permittivity layer 114 whose permittivity is higher than that of the insulating layer 104 makes it possible to more suppress a rise in oxide film converted film thickness EOT (Equivalent Oxide Thickness) between the lowermost layer conductive layer 102b and the semiconductor substrate 101, while securing a physical film thickness, compared to when the insulating layer 104 is simply film thickened.

Being able to suppress the rise in EOT means being able to adjust such that while there is secured a physical film thickness sufficient to prevent the previously mentioned impairment with respect to damage during processing or due to gas and to secure a margin during contact formation, device characteristics (particularly, on/off switching characteristics of a gate) are not lowered by an oxide film converted film thickness of that physical film thickness.

In the present embodiment, as shown in FIG. 7, a thickness T1 of an insulating layer 127 (block insulating layer 113, high permittivity layer 114, and insulating layer 104) between the lowermost layer conductive layer 102b and the semiconductor substrate 101 is made larger than a thickness T2 of an insulating layer 128 (block insulating layer 113 and oxide layer 115) between the lowermost layer conductive layer 102b and the epitaxial layer 112.

On the other hand, although the lowermost layer conductive layer 102b functions as the source side select gate line SGS, when the oxide film converted film thickness E1 of the insulating layer 127 and oxide film converted film thickness E2 of the insulating layer 128 greatly diverge, a divergence ends up occurring also between switching characteristics between the conductive layer 102b and the substrate 101 and switching characteristics between the conductive layer 102b and the epitaxial layer 112, and there is a risk of device characteristics being affected. However, by making the physical film thickness T1 larger than T2 as described above, it becomes possible to set the oxide film converted film thickness E1 to be about the same as the oxide film converted film thickness E2. Specifically, if a difference of the oxide film converted film thicknesses E1 and E2 is less than 20 percent, for example, deterioration of device characteristics can be suppressed.

[Method of Manufacturing]

Next, a method of manufacturing a semiconductor memory device according to the first embodiment will be described with reference to FIGS. 9 to 24.

Figure 9:
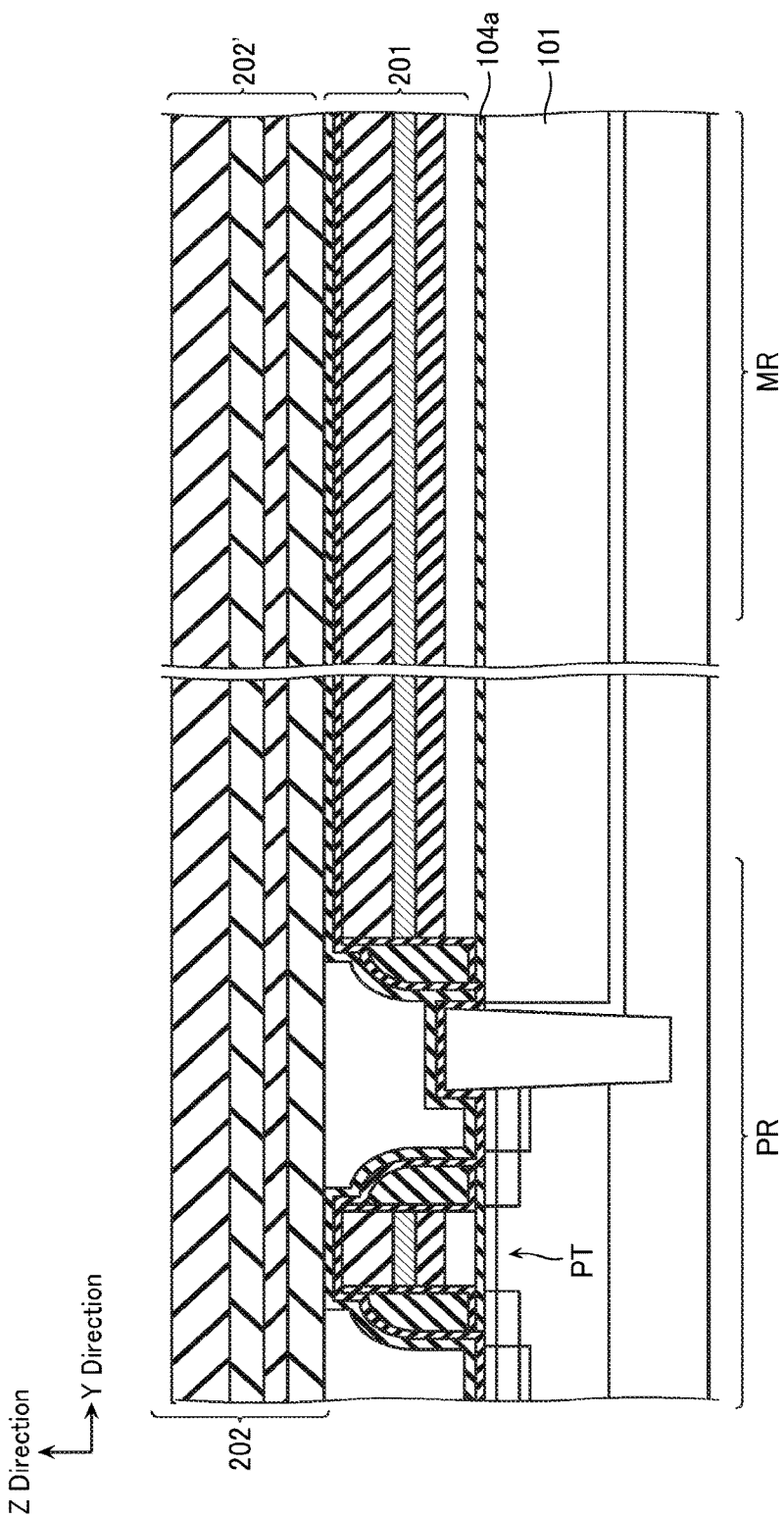

As shown in FIG. 9, the peripheral transistor PT is formed in the peripheral region PR of the substrate 101. At this time, a gate insulating layer 104a of the peripheral transistor PT is formed continuously so as to straddle the peripheral region PR and the memory cell array region MR. Formed in the memory cell array region MR is a stacked structure 201 configuring the peripheral transistor PT. Moreover, formed on an upper part of the peripheral transistor PT is a protective layer 202 configured from a plurality of insulating layers.

Figure 10:
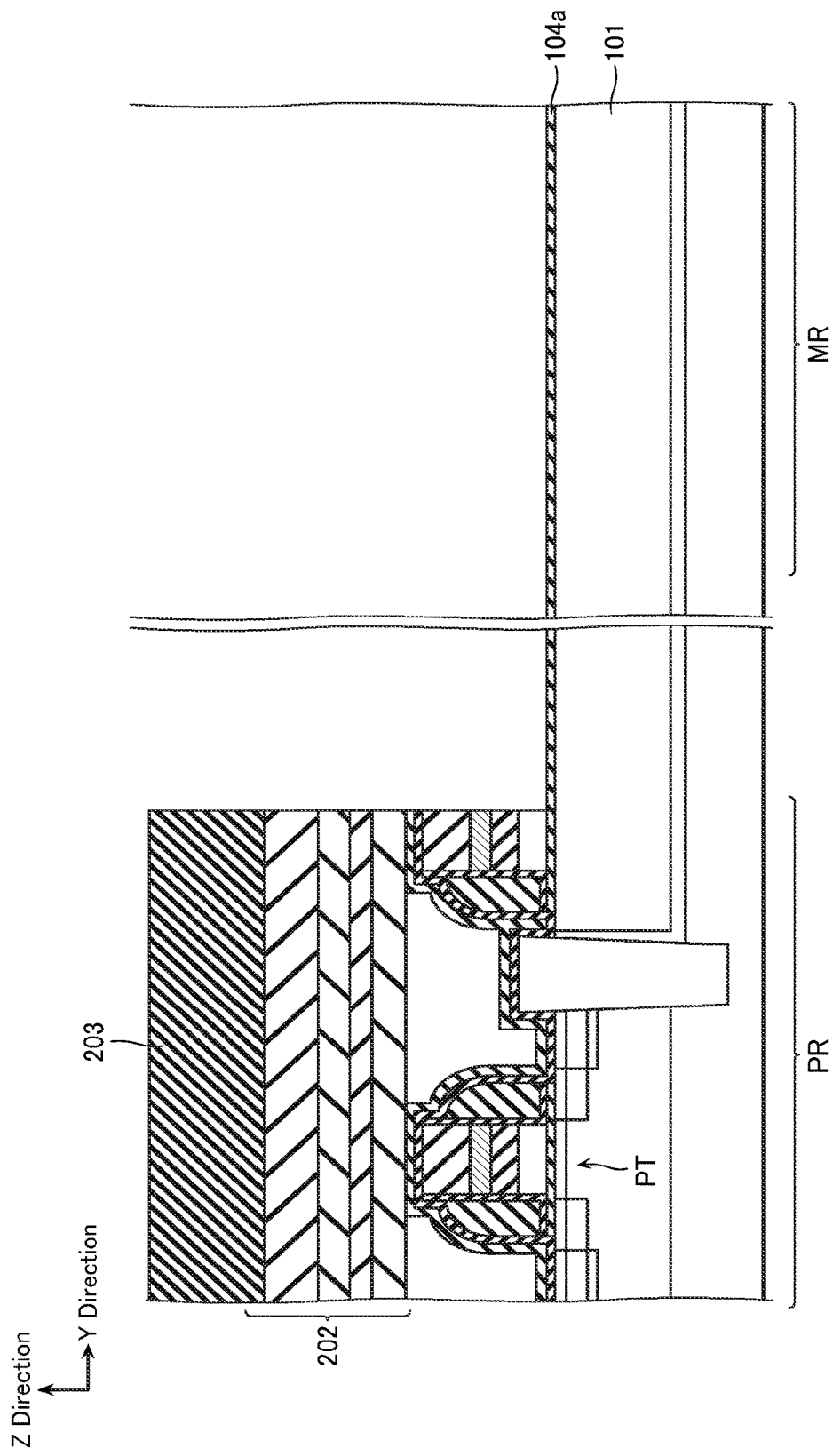

As shown in FIG. 10, the stacked structure 201 and the protective layer 202 of the memory cell array region MR are removed by the likes of RIE or wet etching using an insulating layer 203 as a mask. Moreover, the gate insulating layer 104a of the peripheral transistor PT is not removed.

Figure 11:
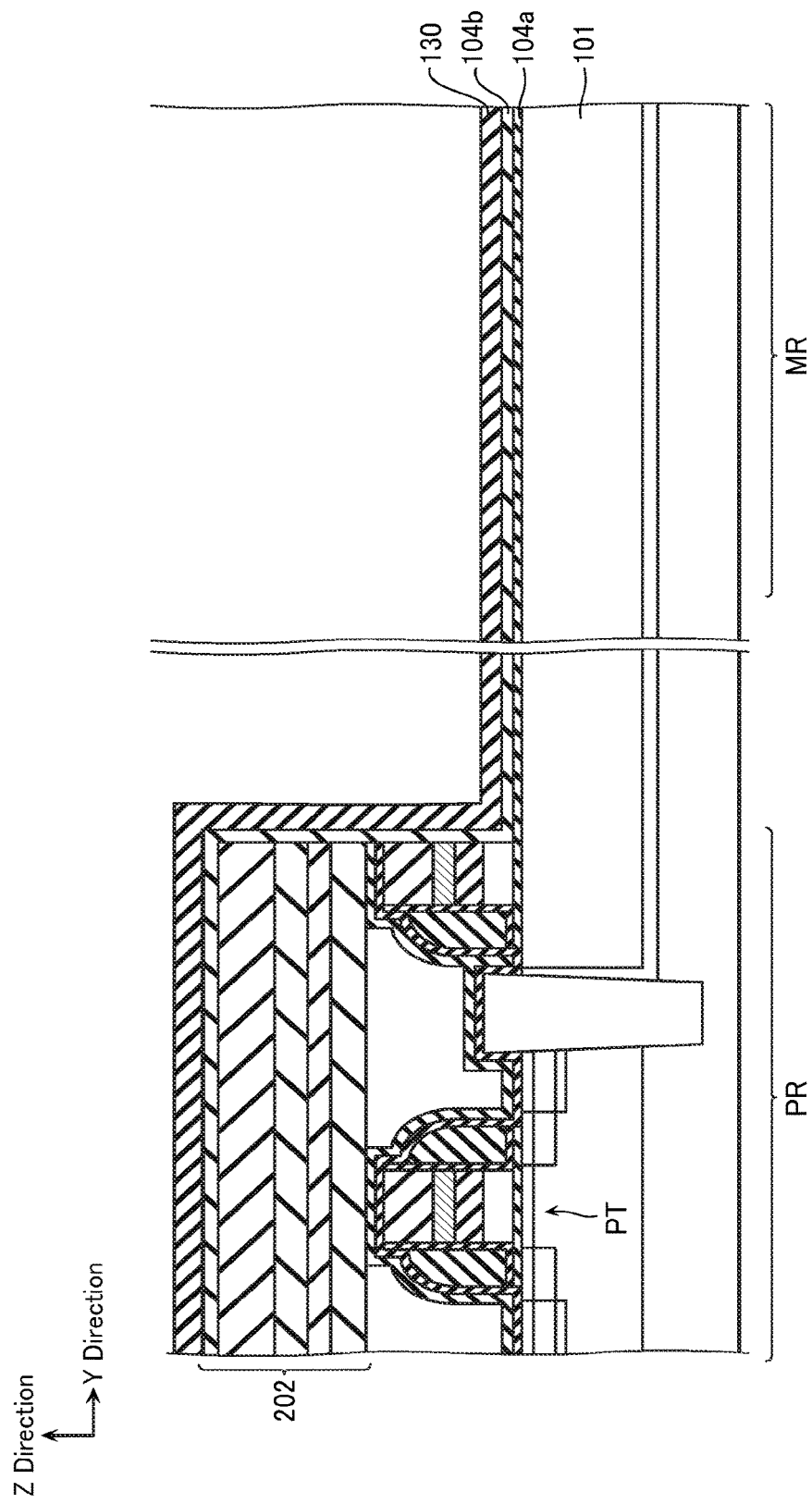

As shown in FIG. 11, an insulating layer 104b acting as a liner film and an insulating layer 130 functioning as a stopper, and so on, in later contact formation, are formed by using a deposition method such as CVD. The insulating layer 104b is configured from silicon oxide. The insulating layer 130 is configured from silicon nitride, for example. Note that other layers or films could be similarly formed by using a deposition method.

Figure 12:
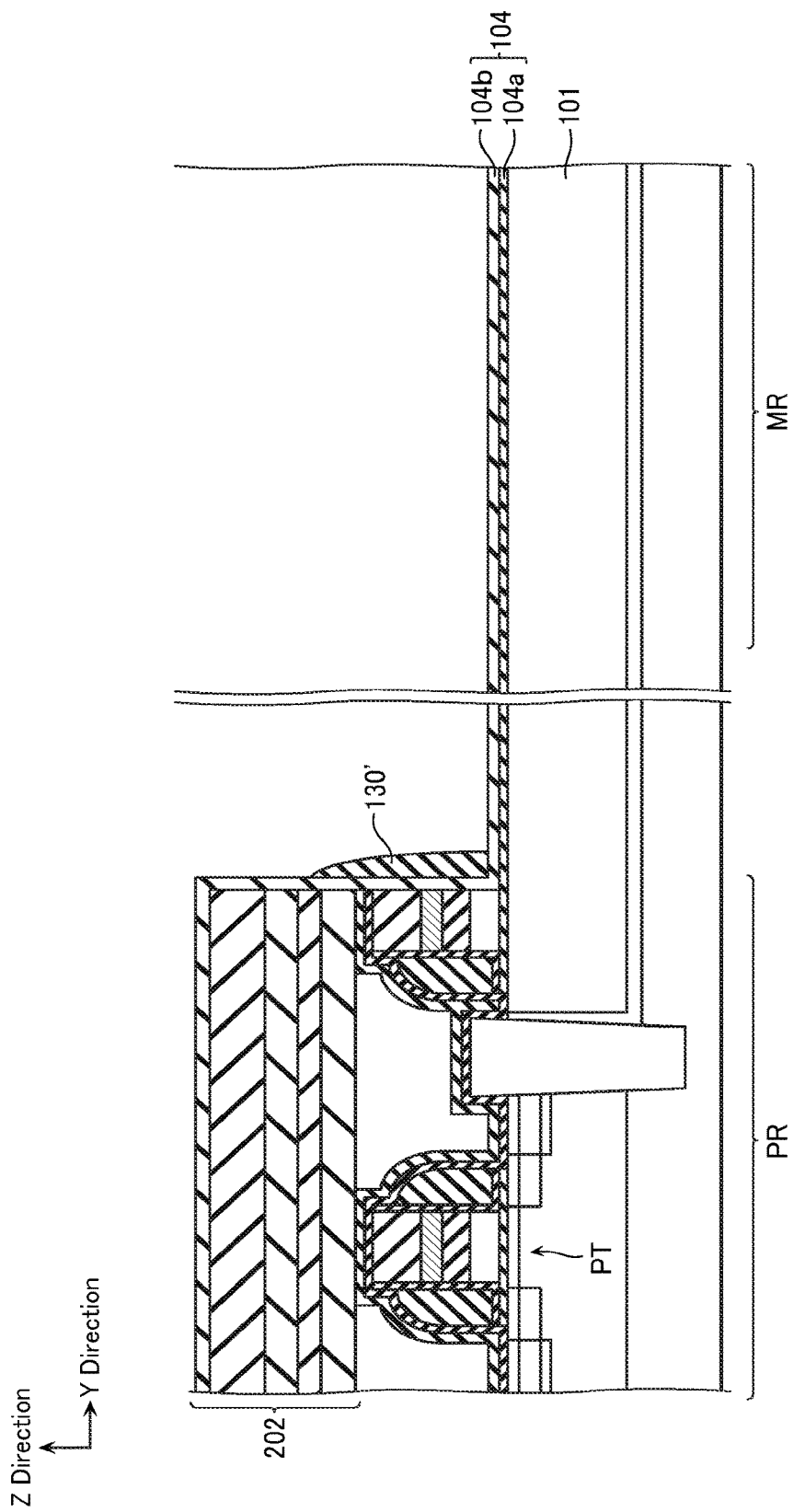

As shown in FIG. 12, the insulating layer 130 is removed by RIE or the like. Now, in the present embodiment, the insulating layer 130 is configured from silicon nitride, and the insulating layers 104a and 104b are configured from silicon oxide. Moreover, when removing the insulating layer 130, a method having low selectivity with respect to an insulating layer configured from silicon oxide, such as wet etching using a phosphoric acid-based solution, for example, is adopted.

Figure 13:
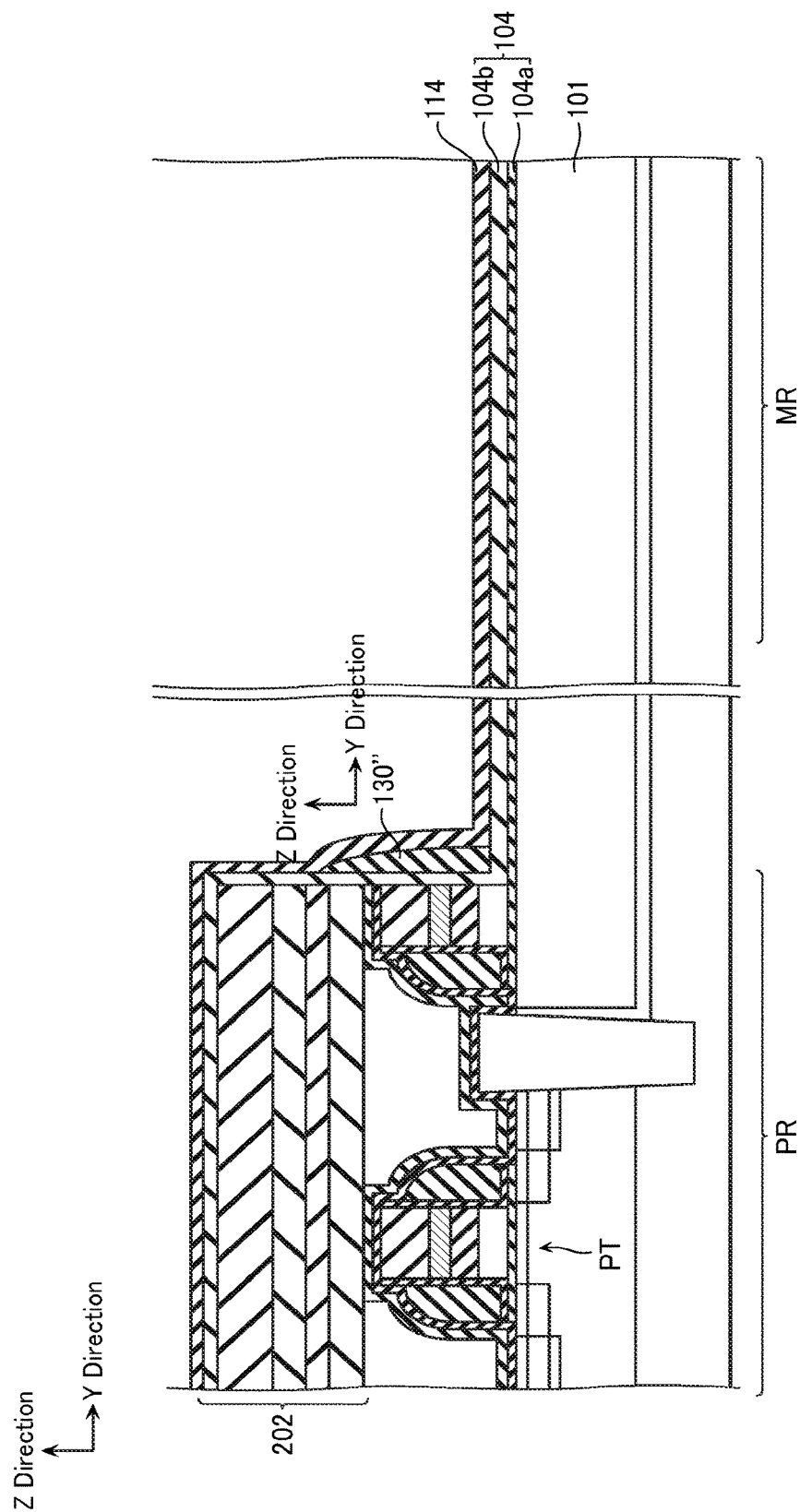

As shown in FIG. 13, the high permittivity layer 114 is formed, by the likes of a CVD method, on the insulating layer 104b. This high permittivity layer 114 is also formed continuously so as to straddle the peripheral region PR and the memory cell array region MR.

Figure 14:
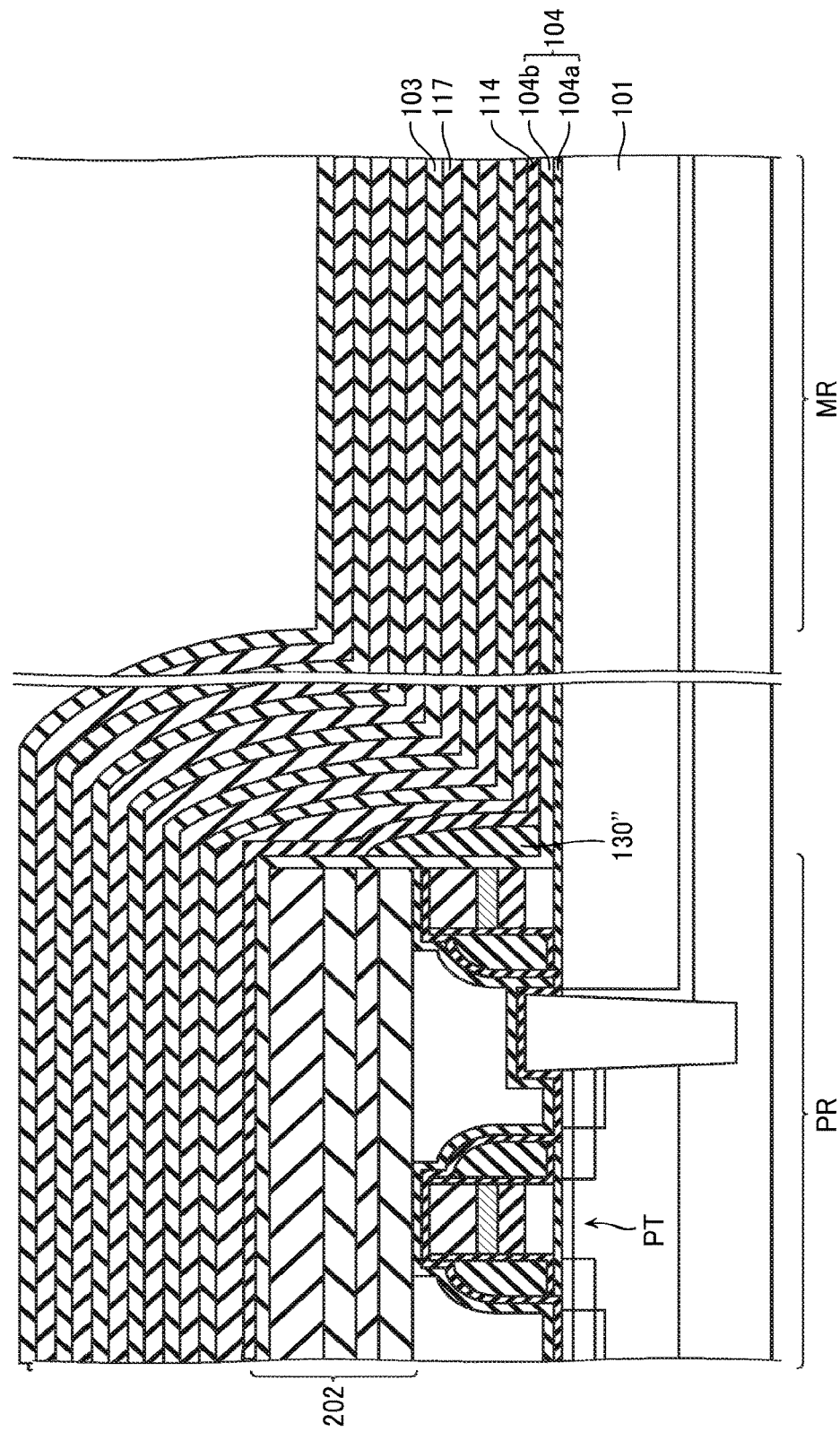

As shown in FIG. 14, a sacrifice layer 117 and the inter-layer insulating layer 103 are repeatedly formed alternately on the high permittivity layer 114.

FIG. 15 shows an enlarged view of part of the memory cell array region MR in this state. Moreover, as may be understood from the above description, in the present embodiment, the insulating layer 104 is configured as a stacked structure of the gate insulating layer 104a of the peripheral transistor PT and the insulating layer 104b acting as the liner film explained by FIG. 11.

As shown in FIG. 16, patterning of a desired pattern is performed by lithography, and a memory hole MH is formed by RIE or wet etching.

Figure 17:
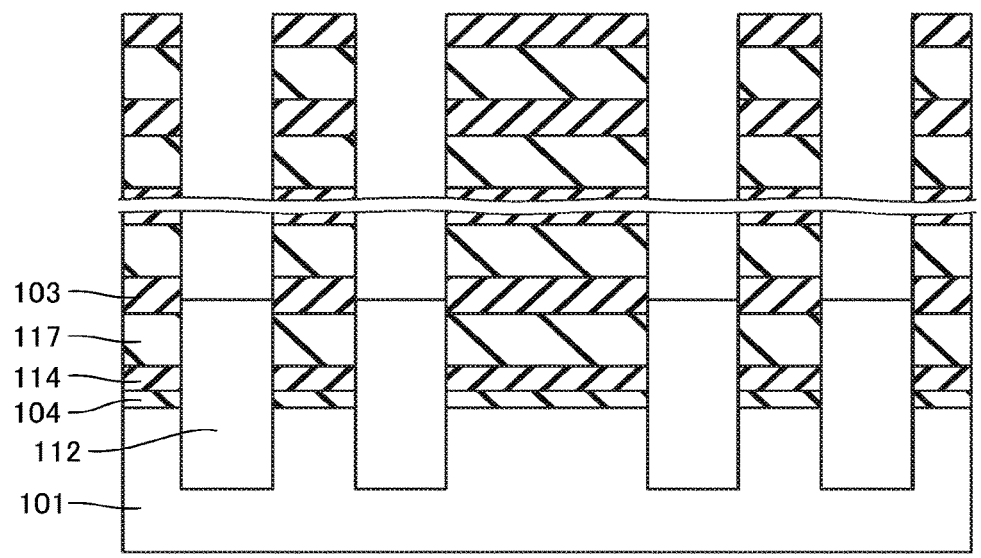

As shown in FIG. 17, the substrate 101 exposed in a bottom part of the memory hole MH is selectively grown by an epitaxy method using the likes of a gas including silicon, thereby forming the epitaxial layer 112.

Figure 18:
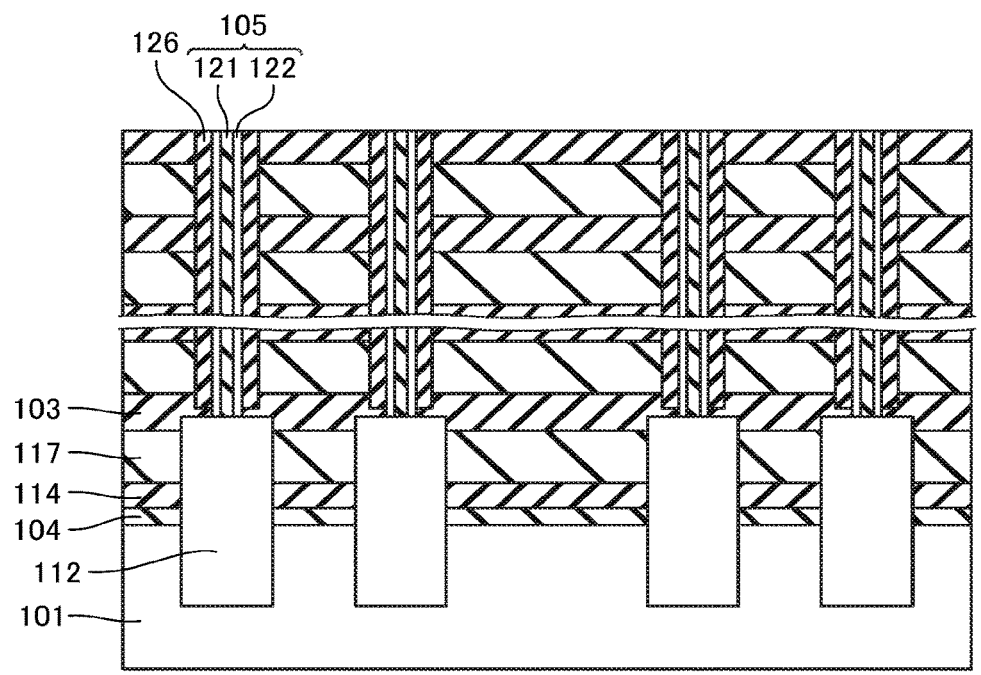

As shown in FIG. 18, the memory film 126 and the memory columnar body 105 are sequentially formed in the memory hole MH.

Figure 19:
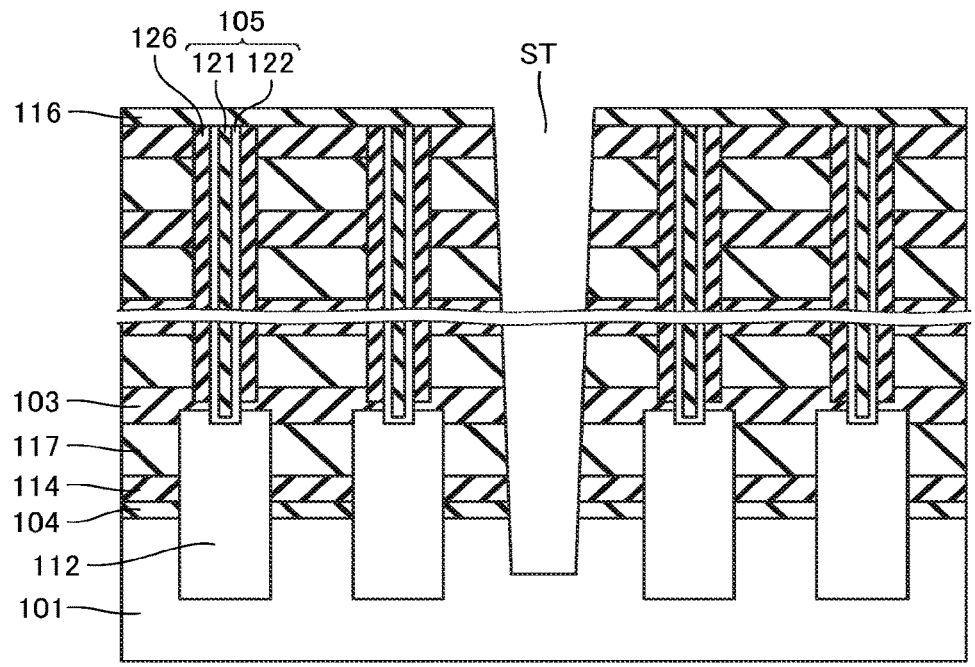

As shown in FIG. 19, the slit ST is formed by RIE or wet etching using a hard mask 116 as a mask.

Figure 20:
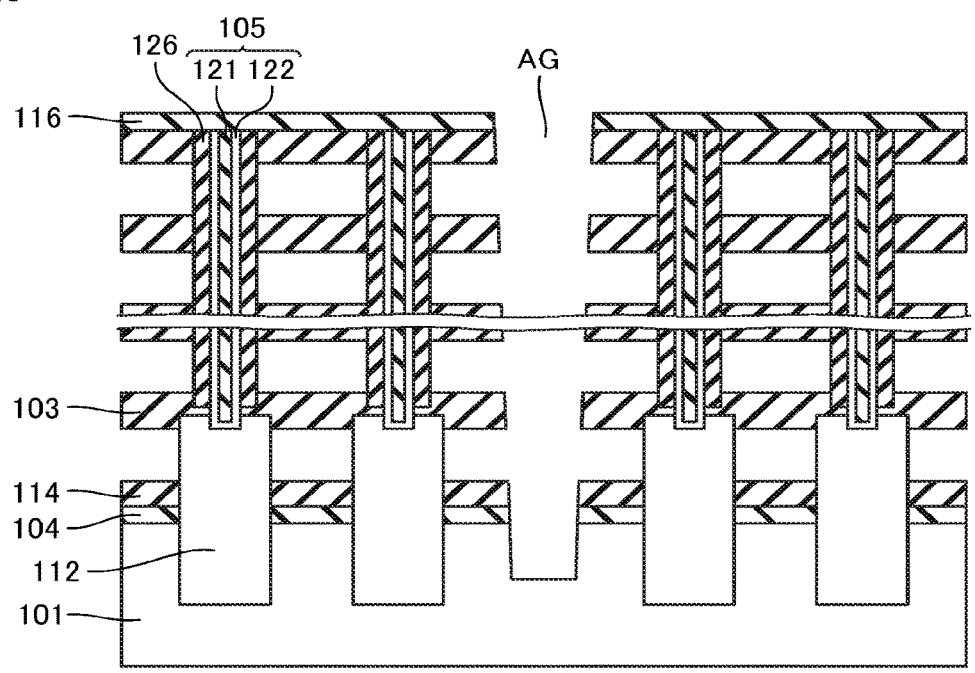

As shown in FIG. 20, the sacrifice layer 117 is removed by wet etching, via the slit ST. When the sacrifice layer 117 is configured from silicon nitride, a phosphoric acid-based solution can be employed as a chemical solution. In this way, an air gap AG is formed. At this time, when the high permittivity layer 114 is configured from a material having low selectivity with respect to a phosphoric acid-based solution, such as silicon nitride, there is a risk that the high permittivity layer 114 ends up being removed along with the sacrifice layer 117. Therefore, the high permittivity layer 114 adopts a material having high selectivity with respect to the chemical solution employed in removal of the sacrifice layer 117.

Figure 21:
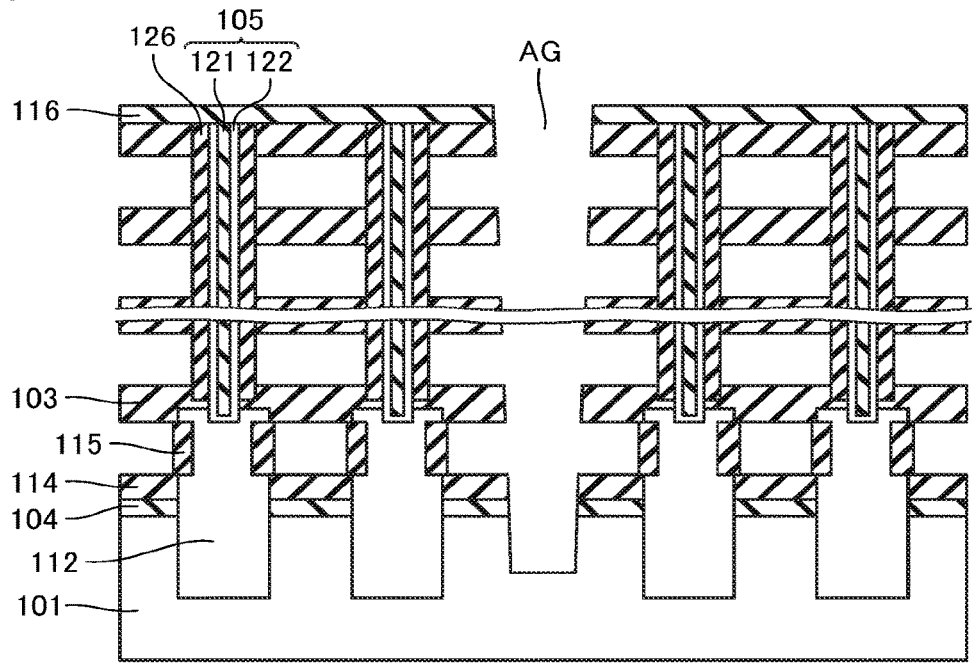

As shown in FIG. 21, a portion exposed in the air gap AG, of the epitaxial layer 112 is oxidized by performing thermal oxidation processing or the like, and the oxide layer 115 is formed.

Figure 22:
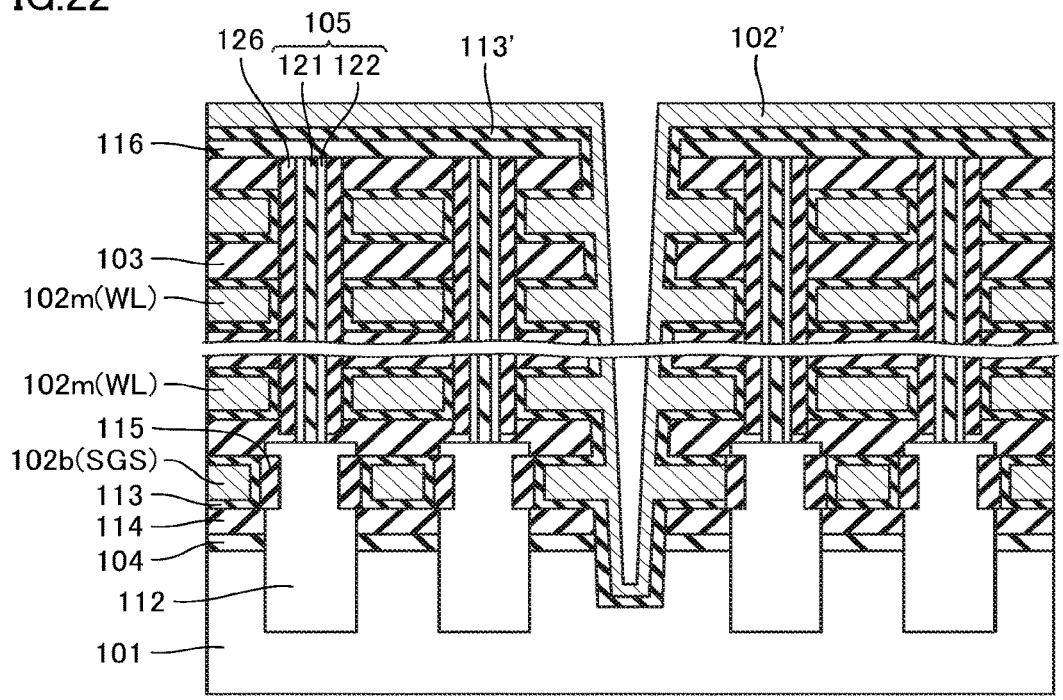

As shown in FIG. 22, the block insulating layer 113 and the conductive layer 102 are sequentially formed by the likes of a CVD method, via the air gap AG.

Figure 23:
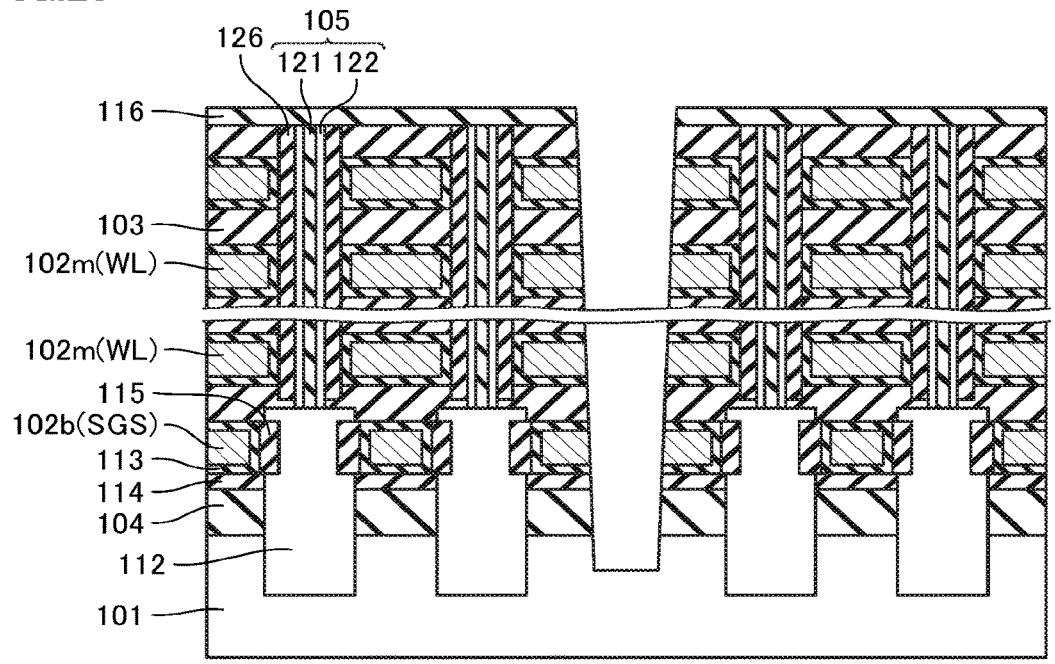

As shown in FIG. 23, a block insulating layer 113' and conductive layer 102' formed on an inner sidewall of the slit ST and upper surface of the hard mask 116, are removed by the likes of wet etching.

Figure 24:
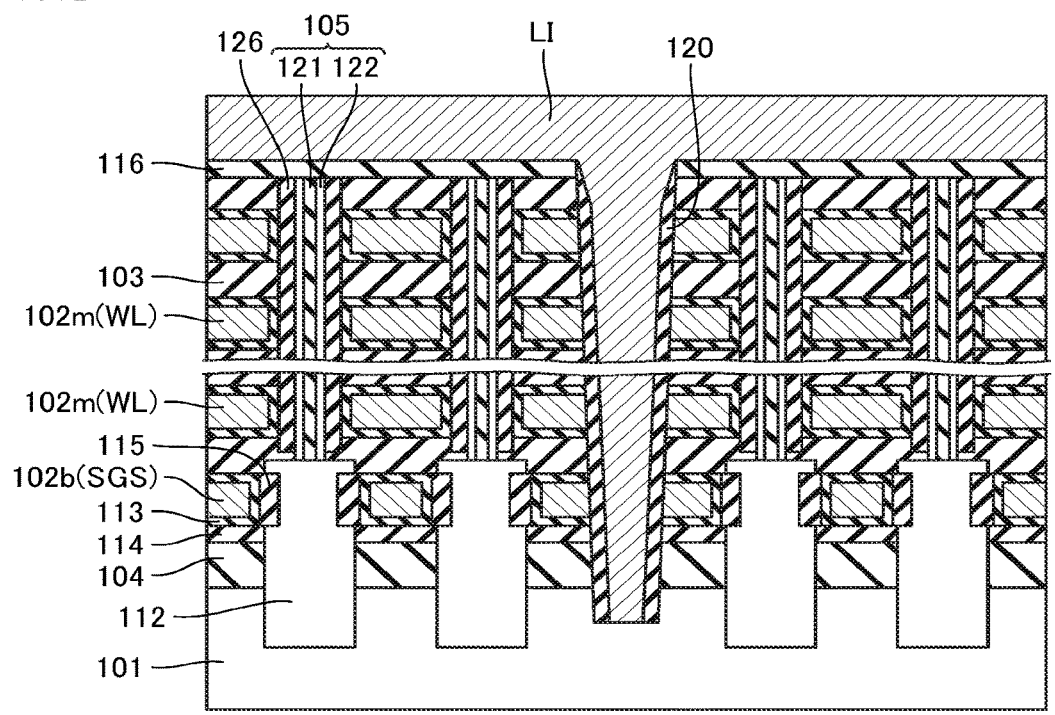

As shown in FIG. 24, the inter-layer insulating layer 120 and the source contact LI are sequentially formed, by the likes of a CVD method, on the inner sidewall of the slit ST.

Finally, planarization is performed at the upper surface of the hard mask 116 by CMP or the like, and the configuration of FIG. 6 is obtained.

As described above, in the method of manufacturing according to the present embodiment, the high permittivity layer 114 having a permittivity which is much higher than the permittivity of the insulating layer 104 is provided on the substrate 101, in addition to the insulating layer 104 being provided on the substrate 101. Therefore, as mentioned above, a rise in oxide film converted film thickness is suppressed while securing physical film thickness, and it is possible to achieve both prevention of impairment of the insulating layer 104 in a manufacturing step and prevention of deterioration of device characteristics.

In addition, the insulating layers mediating between the lowermost layer conductive layer 102b and the substrate 101 or epitaxial layer 112, namely, the insulating layer 104, the block insulating layer 113, the high permittivity layer 114, and the oxide layer 115, are formed separately. Therefore, film thickness can be adjusted on an insulating layer basis, and formation under conditions satisfying desired physical film thickness and oxide film converted film thickness, is made possible.

Modified Example According to First Embodiment

In the above-described embodiment, the gate insulating layer 104a of the peripheral transistor PT and the insulating layer 104b acting as the liner film were utilized as the insulating layer 104, without them being removed (refer to FIGS. 12 and 13, for example).

Figure 25:
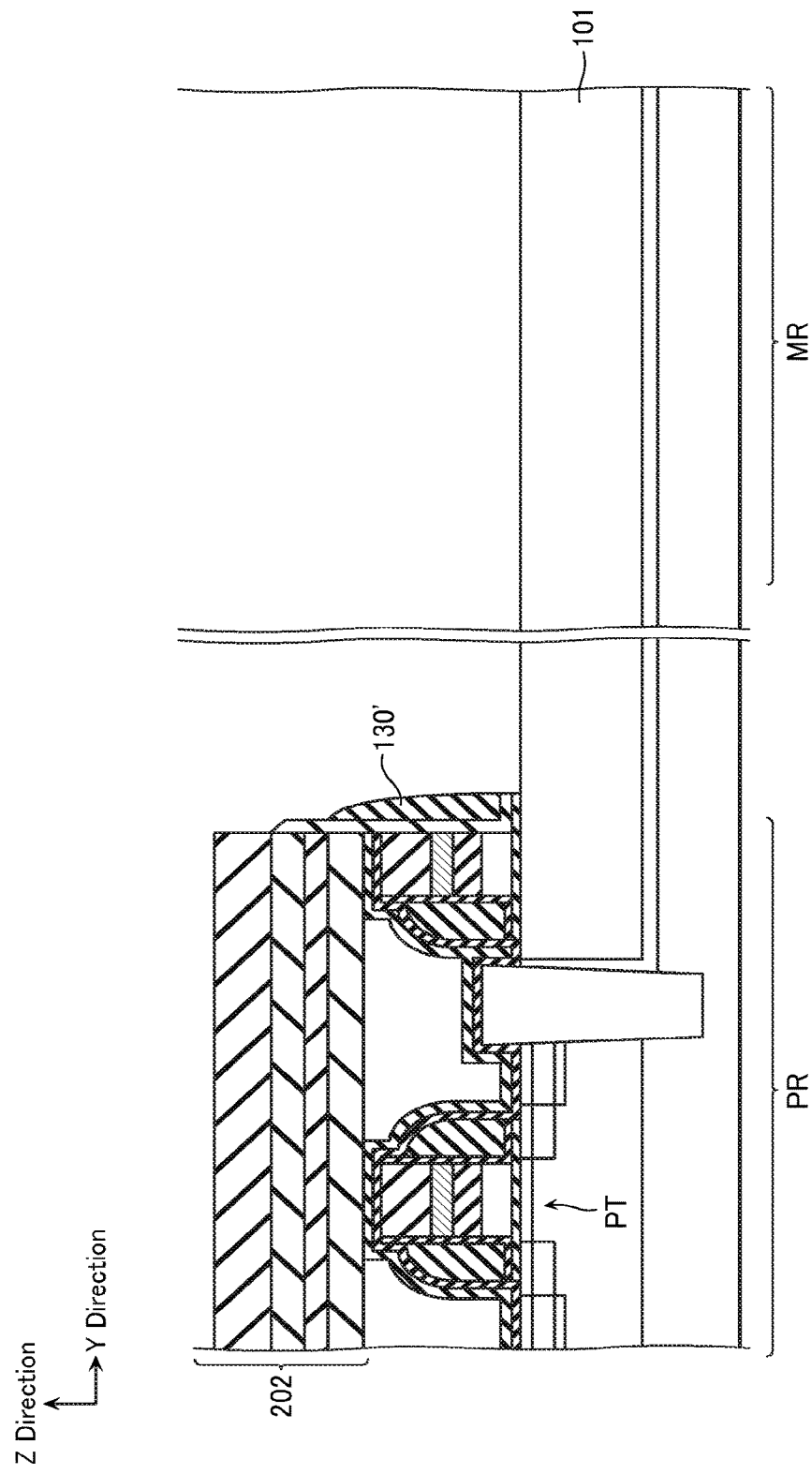
FIGS. 25 and 26 are cross-sectional views showing modified examples of the manufacturing steps, for the semiconductor memory device according to the first embodiment.
Figure 26:
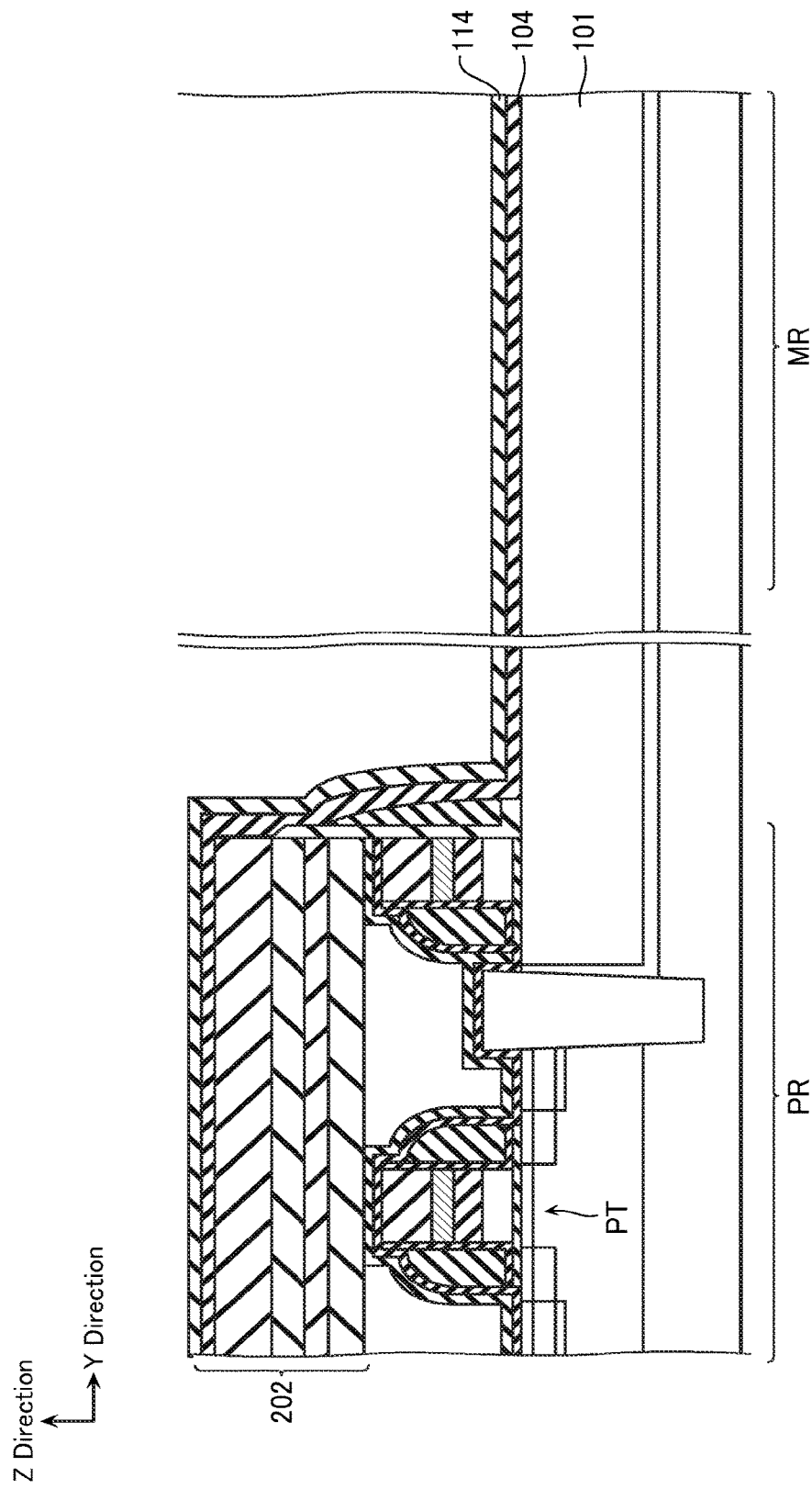

However, after the step of FIG. 12, as shown in FIG. 25, the gate insulating layer 104a of the peripheral transistor PT and the insulating layer 104b are sometimes removed. In such a case, as shown in FIG. 26, the insulating layer 104 and the high permittivity layer 114 continuous so as to straddle the peripheral region PR and the memory cell array region MR may be formed again.

Note that the insulating layer 104b in the peripheral region PR is not necessarily removed. Moreover, the insulating layer 104 and/or high permittivity layer 114 of the peripheral region PR, formed in the step of FIG. 26, can also be removed in a later step.

In this case, contrary to in the above-described embodiment, the insulating layer 104 attains a single-layer structure not including the gate insulating layer 104a of the peripheral transistor PT.

In addition, it is also possible to form the high permittivity layer 114 earlier, and form the insulating layer 104 in a layer above it. By the high permittivity layer 114 being disposed directly above the substrate 101, ON characteristics of the memory cell MC improve. Furthermore, it is also possible to adopt a configuration of a kind where a plurality of the insulating layers 104 configured from silicon oxide and high permittivity layers configured from the likes of alumina or hafnium oxide are alternately stacked.

Second Embodiment

[Configuration]

A configuration of a semiconductor memory device according to a second embodiment will be described.

The semiconductor memory device according to the second embodiment has an overall configuration which is largely identical to that of the semiconductor memory device according to the first embodiment. Therefore, configurations identical to those of the first embodiment will be assigned with identical reference symbols to those assigned in the first embodiment, and descriptions thereof will sometimes be omitted.

Figure 27:
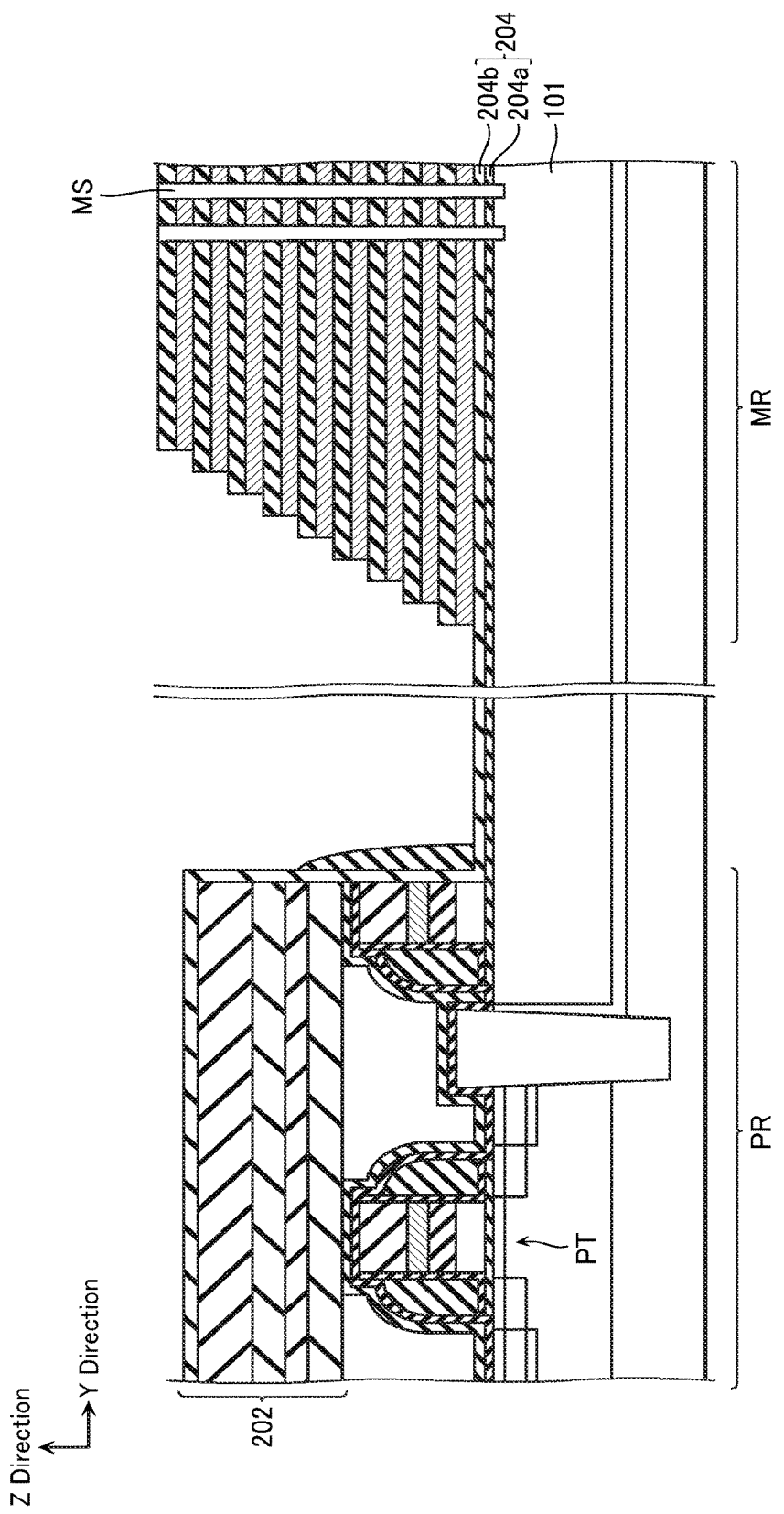
FIGS. 27 and 28 are schematic cross-sectional views showing configurations of a semiconductor memory device according to a second embodiment.
Figure 28:
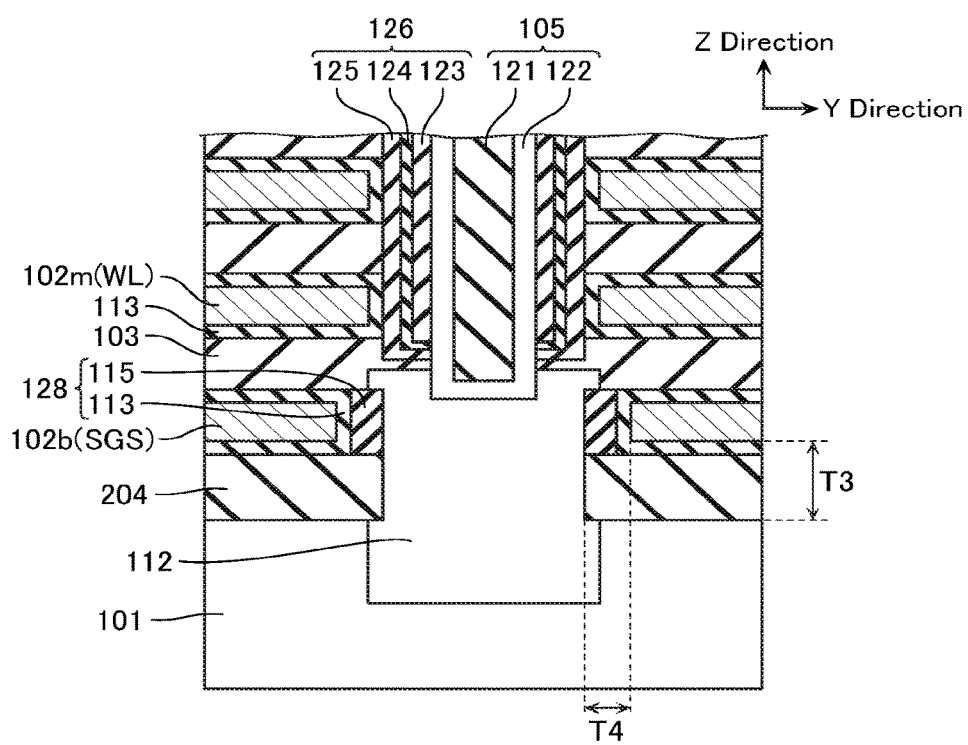

As shown in FIGS. 27 and 28, in the second embodiment, only an insulating layer 204 is disposed, and a high permittivity layer is not disposed, between the lowermost layer conductive layer 102b and the substrate 101, this point differing from the first embodiment.

Moreover, a physical film thickness T3 of the insulating layer between the lowermost layer conductive layer 102b and the substrate 101 is larger than a physical film thickness T4 of the insulating layer between the lowermost layer conductive layer 102b and the epitaxial layer 112. Moreover, a thickness of the insulating layer 204 is preferably larger than a thickness of the inter-layer insulating layer 103.

Such a configuration also makes it possible for a margin when forming a contact or the like to be secured in large measure, and makes is possible to suppress that the insulating layer 204 is impaired by damage due to the likes of RIE or gas whereby device characteristics deteriorate. Moreover, the physical film thickness T4 of the insulating layer between the lowermost layer conductive layer 102b and the epitaxial layer 112 is smaller than the thickness T3 of the insulating layer between the lowermost layer conductive layer 102b and the substrate 101. Therefore, it can be suppressed that switching characteristics between the conductive layer 102b functioning as the source side select gate line SGS and the epitaxial layer 112 deteriorate, and deterioration of device characteristics overall can be prevented.

[Method of Manufacturing]

Figure 29:
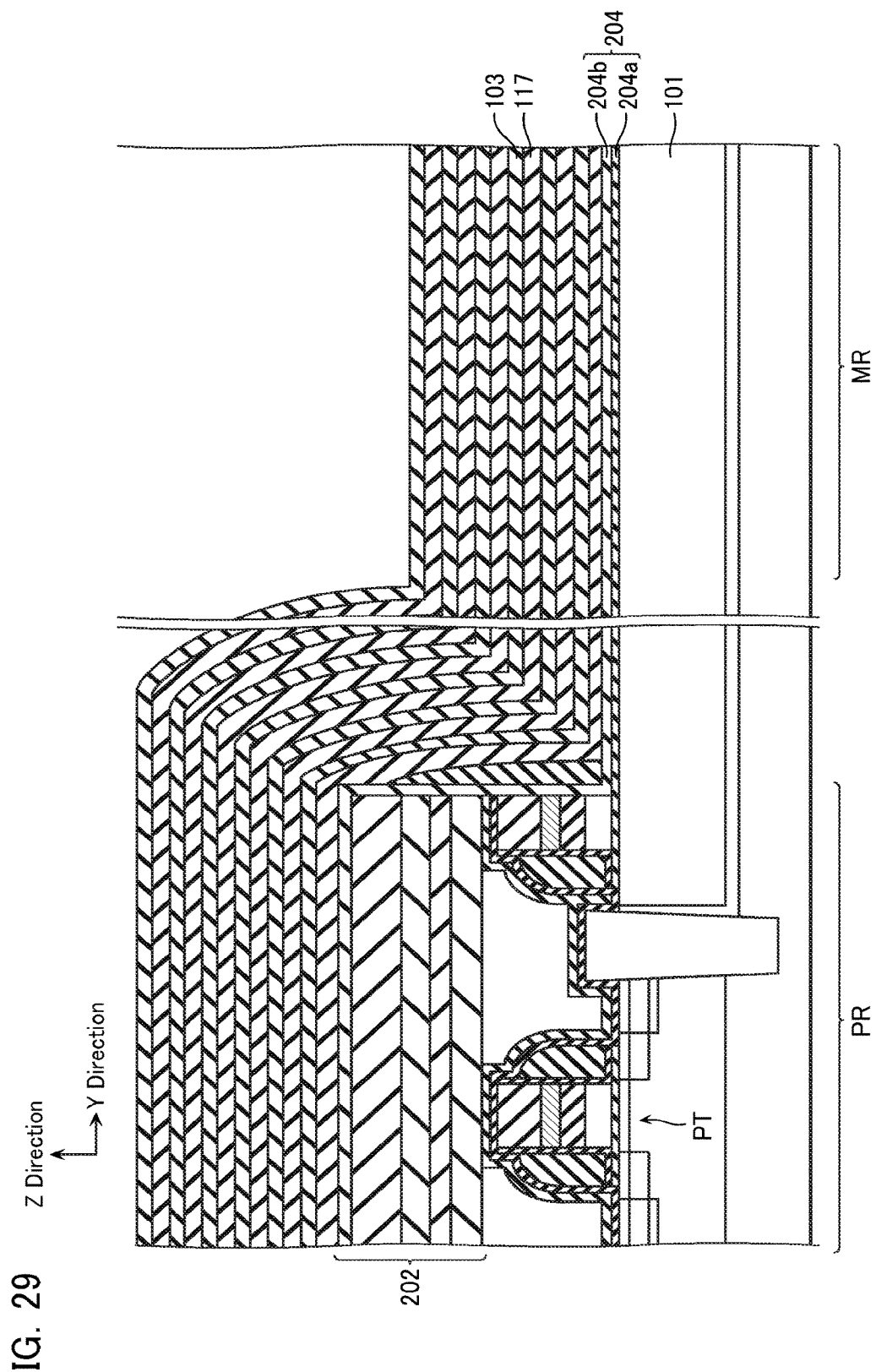
FIG. 29 is a schematic cross-sectional view showing a method of manufacturing the same semiconductor memory device.

A method of manufacturing a semiconductor memory device according to the second embodiment will be described using FIG. 29.

The method of manufacturing a semiconductor memory device according to the second embodiment is similar to that of the first embodiment for the steps shown in from FIG. 9 to FIG. 12.

In the second embodiment, after the step of FIG. 12, the sacrifice layer 117 and the inter-layer insulating layer 103 are repeatedly formed alternately on an insulating layer 204b, without a high permittivity layer being formed.

Subsequent steps are similar to those of the first embodiment described by FIGS. 16 to 24.

According to the present embodiment, a gate insulating layer 204a of the peripheral transistor PT is utilizable as the insulating layer 204 without being removed, and the step of forming a high permittivity layer is also omitted, hence even more simplification of the manufacturing steps is achieved.

Modified Example According to Second Embodiment

Figure 30:
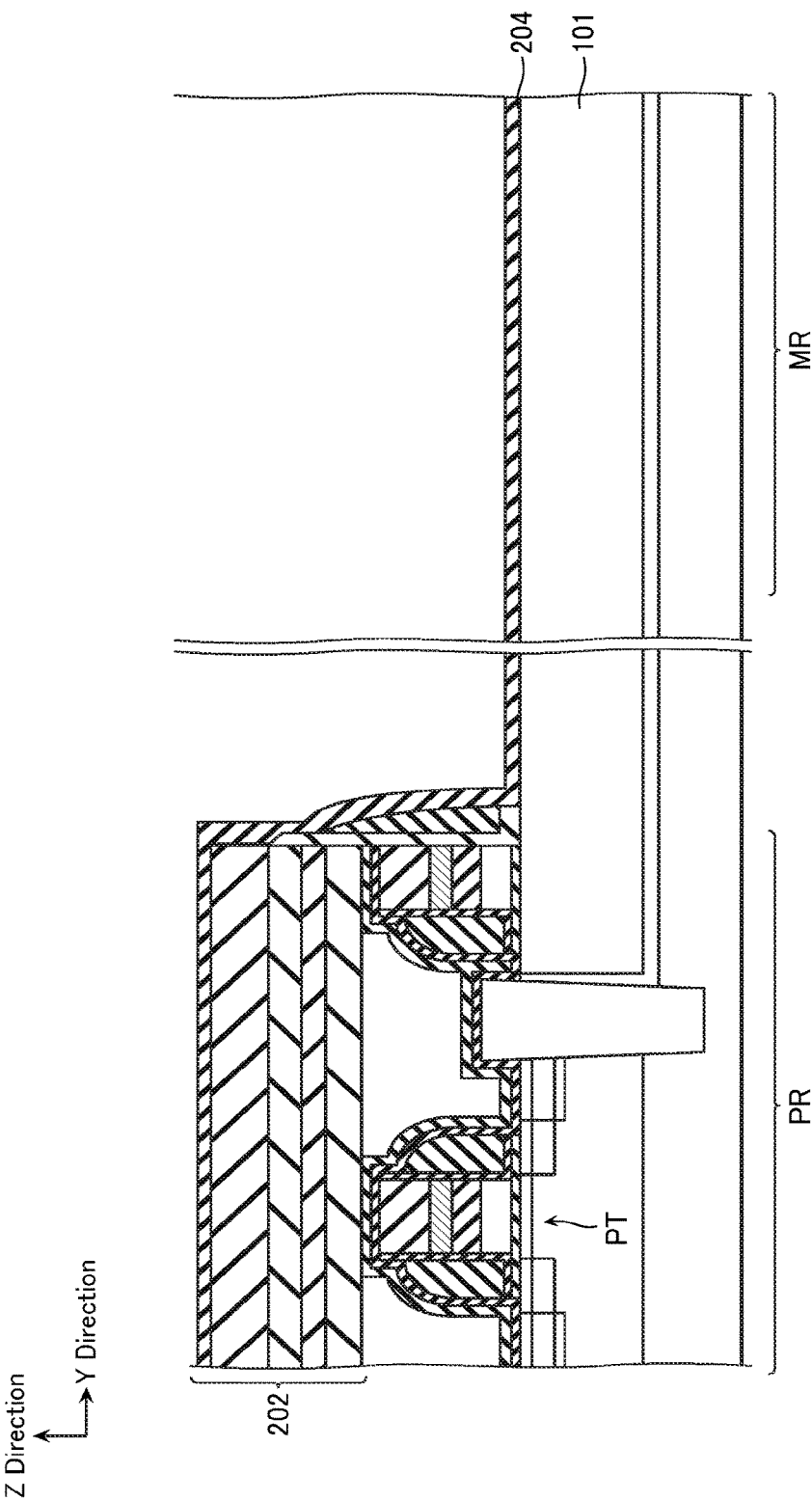
FIG. 30 is a cross-sectional view showing a modified example of a manufacturing step, for the semiconductor memory device according to the second embodiment.

In the second embodiment also, as shown in FIG. 30, the insulating layer 204 may be formed again after removal of the gate insulating layer 204a and insulating layer 204b. In this case, the insulating layer 204 attains a single-layer structure not including the gate insulating layer 204a of the peripheral transistor PT.

Third Embodiment

The embodiments above described configurations for the insulating layers between the lowermost layer conductive layer 102b and the substrate 101 or epitaxial layer 112.

Figure 31:
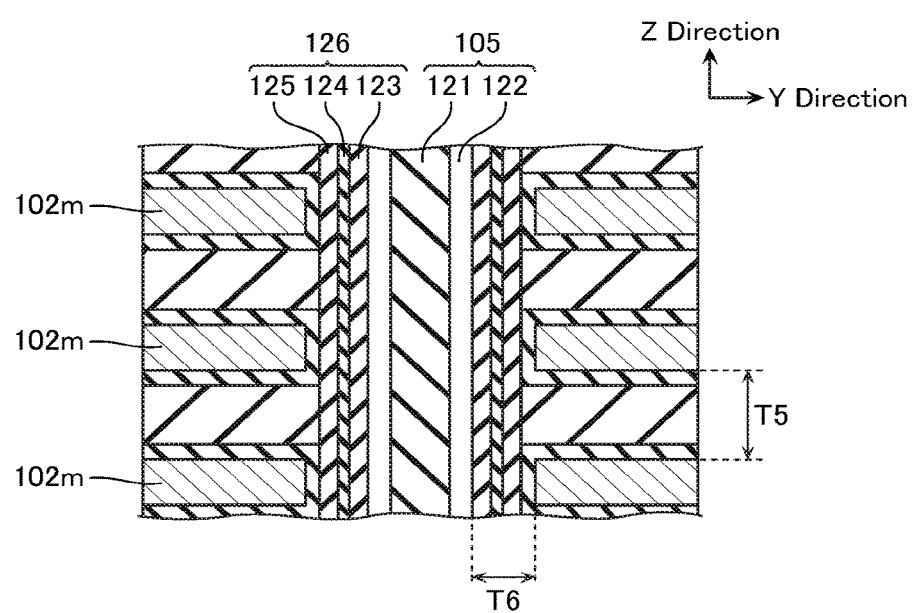
FIG. 31 is a schematic cross-sectional view showing a configuration of a semiconductor memory device according to a third embodiment.

However, as shown in FIG. 31, in a third embodiment, a physical film thickness T5 of the insulating layer (inter-layer insulating layer 103 and block insulating layer 113) between a pair adjacent in the Z direction, of other-than-lowermost-layer conductive layers 102m is configured larger than a physical film thickness T6 of the insulating layer (block insulating layer 113 and memory film 126) between the conductive layer 102m and the semiconductor layer 122.

Such a configuration makes it possible to suppress a short circuit of fellow conductive layers 102m functioning as the word lines WL.

Note that it is of course also possible for the embodiments or modified examples described above to be respectively combined.

[Semiconductor Material]

In the above-described embodiments or modified examples, polysilicon was given as an example of a material of the semiconductor layer 122. However, the material is not limited to polysilicon, and it is also possible to employ a material such as SiGe, SiC, Ge, C, and so on. Moreover, during joining of the semiconductor and another wiring line or the like, the following are used, namely, a silicide employing Sc, Ti, V, Cr, Mn, Fe, Co, Ni, Cu, Zn, Rh, Pd, Ag, Cd, In, Sn, La, Hf, Ta, W, Re, Os, Ir, Pt, or Au, or these silicides having added thereto one or two or more of the elements Sc, Ti, V, Cr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, or Au.

[Memory Film Material]

Usable as a material configuring the memory film 126 (tunnel insulating layer 123, charge accumulation layer 124, and block insulating layer 125) are the following materials, including materials already given.

(A) Oxide $SiO2$, $Al_2O_3$, $Y_2O_3$, $La_2O_3$ $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and so on. Alternatively, an oxide expressed by $AB_2O_4$. However, A and B are the same or different elements, and are one of Al, Sc, Ti, V, Cr, Mn, Fe, Co, Ni, Cu, Zn, Ga, and Ge. For example, $Fe_3O_4$, $FeAl_2O_4$, $Mn_{1+x}Al_{2-x}O_{4+y}$, $Co_{1+x}Al_{2-x}O_{4+y}$, $MnO_x$, and so on. Alternatively, an oxide expressed by $ABO_3$. However, A and B are the same or different elements, and are one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $LaAlO_3$, $SrHfO_3$, $SrZrO_3$, $SrTiO_3$, and so on.

(B) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, and so on. Alternatively, a material in which some of the oxygen elements of the oxides mentioned in (A) above are substituted by a nitrogen element. Particularly, single and multiple insulating layers are each preferably selected from the group of $SiO_2$, SiN, $Si_3N_4$, $Al_2O_3$, SiON, $HfO_2$, HfSiON, $Ta_2O_5$, $TiO_2$, and $SrTiO_3$. Particularly, Si system insulating films of the likes of $SiO_2$, SiN, and SiON include ones in which concentrations of oxygen elements and nitrogen elements are each $1 \times 10^{18}$ atoms/cm$^3$ or more. However, barrier heights of multiple insulating layers differ from each other. Moreover, the insulating layer includes an impurity atom forming a defect level or a semiconductor/metal dot (quantum dot).

[Conductive Layer Material]

Usable as a material configuring the likes of the word line WL or bit line BL are the following materials, including materials already given. For example, the following may be used, namely, W, WN, Al, Ti, V, Cr, Mn, Fe, Co, Ni, Cu, TiN, WSix, TaSix, PdSix, ErSix, YSix, PtSix, HfSix, NiSix, CoSix, TiSix, VSix, CrSix, MnSix, FeSix, and so on.

An electrode layer may include a single body or mixture of a plurality of metal elements, a silicide or oxide, a nitride, and so on, and specifically is configured from the likes of Pt, Au, Ag, TiAlN, SrRuO, Ru, RuN, Ir, Ti, V, Cr, Mn, Fe, Co, Ni, Cu, TiN, TaN, LaNiO, Al, PtIrOx, PtRhOx, Rh, TaAlN, SiTiOx, WSix, TaSix, PdSix, PtSix, IrSix, ErSix, YSix, HfSix, NiSix, CoSix, TiSix, VSix, CrSix, MnSix, FeSix, and so on. The electrode layer may simultaneously function as a barrier metal layer or adhesive layer.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first insulating layer disposed on a semiconductor substrate;
a first semiconductor layer disposed on the semiconductor substrate;
a plurality of memory cells arranged three-dimensionally above the first insulating layer and disposed above the first semiconductor layer;
a plurality of conductive layers stacked in a first direction that intersects a surface of the semiconductor substrate;
a second insulating layer covering a side surface of a lowermost layer of the plurality of conductive layers;
an oxide layer disposed on a side surface of the first semiconductor layer and contacting the second insulating layer; and
a high permittivity layer provided between the first insulating layer and the second insulating layer, a permittivity of the high permittivity layer being higher than that of the first insulating layer and the high permittivity layer directly contacting the side surface of the first semiconductor layer.

2. The semiconductor memory device according to claim 1, wherein the first semiconductor layer is an epitaxial layer configured from epitaxial silicon.

3. The semiconductor memory device according to claim 1, wherein the first insulating layer contacts the side surface of the first semiconductor layer.

4. The semiconductor memory device according to claim 1, wherein an entire film thickness of the second insulating layer, the high permittivity layer, and the first insulating layer provided between the lowermost layer of the plurality of conductive layers and the semiconductor substrate is larger than that of the second insulating layer and the oxide layer provided between the lowermost layer of the plurality of conductive layers and the first semiconductor layer.

5. The semiconductor memory device according to claim 1, wherein a difference of an entire oxide film converted film thickness of the second insulating layer, the high permittivity layer, and the first insulating layer provided between the lowermost layer of the plurality of conductive layers and the semiconductor substrate and that of the second insulating layer and the oxide layer provided between the lowermost layer of the plurality of conductive layers and the first semiconductor layer is less than 20 percent.

6. The semiconductor memory device according to claim 1, wherein the high permittivity layer includes aluminum, hafnium, zirconium, titanium, or tantalum.

7. The semiconductor memory device according to claim 1, wherein the high permittivity layer and the second insulating layer include an identical material.

8. The semiconductor memory device according to claim 1, wherein the high permittivity layer is disposed between a pair of the plurality of conductive layers adjacent in the first direction.

9. The semiconductor memory device according to claim 8, wherein a film thickness of an insulating layer between the pair of the plurality of conductive layers adjacent in the first direction is larger than that of an insulating layer between a conductive layer and a channel body of one of the plurality of memory cells.

10. A semiconductor memory device, comprising:

a memory cell array region including:

a first insulating layer disposed on a semiconductor substrate;

a plurality of memory cells arranged along a first direction that intersects a surface of the semiconductor substrate and disposed above the first insulating layer;

a plurality of conductive layers being stacked in the first direction, and which are connected to the plurality of memory cells;

a second insulating layer covering a side surface of a lowermost layer of the plurality of conductive layers; and a high permittivity layer provided between the first insulating layer and the lowermost layer of the plurality of conductive layers, a permittivity of the high permittivity layer being higher than that of the first insulating layer; and a peripheral region including a transistor being disposed in a periphery of the memory cell array region, wherein the first insulating layer is provided continuously so as to cover the memory cell array region and the peripheral region, and is disposed below a gate electrode of the transistor.

11. The semiconductor memory device according to claim 10, wherein an inter-layer insulating layer is provided between the plurality of conductive layers, and an entire film thickness of the first insulating layer is larger than that of the inter-layer insulating layer.

12. The semiconductor memory device according to claim 10, wherein the first insulating layer is configured from silicon oxide.

13. The semiconductor memory device according to claim 10, wherein the high permittivity layer is provided continuously so as to cover the memory cell array region and the peripheral region.

14. The semiconductor memory device according to claim 10, wherein the high permittivity layer includes aluminum, hafnium, zirconium, titanium, or tantalum.

15. The semiconductor memory device according to claim 10, wherein the high permittivity layer and the second insulating layer include an identical material.

* * * * *